(12) United States Patent
Suzuki et al.

(10) Patent No.: US 9,160,403 B2
(45) Date of Patent: Oct. 13, 2015

(54) SIGNAL TRANSMISSION CIRCUIT, SIGNAL TRANSMISSION SYSTEM, AND SIGNAL TRANSMISSION METHOD

(71) Applicant: FUJITSU LIMITED, Kawasaki-shi, Kanagawa (JP)

(72) Inventors: Kosuke Suzuki, Ota (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 64 days.

(21) Appl. No.: 13/888,031

(22) Filed: May 6, 2013

(65) Prior Publication Data

US 2013/0343471 A1 Dec. 26, 2013

(30) Foreign Application Priority Data

Jun. 26, 2012 (JP) .................. 2012-143319

(51) Int. Cl.
*H03K 19/0175* (2006.01)
*H04B 3/02* (2006.01)
*H03K 19/0185* (2006.01)

(52) U.S. Cl.
CPC .......... *H04B 3/02* (2013.01); *H03K 19/018514* (2013.01)

(58) Field of Classification Search
USPC .................... 326/80–83, 86, 87, 62
See application file for complete search history.

(56) References Cited

U.S. PATENT DOCUMENTS

| 6,175,250 | B1 * | 1/2001 | Hedberg | 326/83 |
| 7,728,630 | B1 * | 6/2010 | Ren et al. | 326/86 |
| 7,956,645 | B2 * | 6/2011 | Momtaz | 326/86 |
| 2002/0113638 | A1 | 8/2002 | Takauchi et al. | |
| 2007/0103186 | A1 | 5/2007 | Clements et al. | |
| 2009/0206879 | A1 | 8/2009 | Ishikawa | |
| 2009/0284283 | A1 * | 11/2009 | Denegri | 326/87 |
| 2011/0133780 | A1 * | 6/2011 | Shau | 326/87 |

FOREIGN PATENT DOCUMENTS

| JP | 2001-500326 A | 1/2001 |
| JP | 2002-185300 A | 6/2002 |

(Continued)

OTHER PUBLICATIONS

Christian Menolfi et al., "A 28Gb/s Source-Series Terminated TX in 32nm CMOS SOI", Solid-State Circuits Conference Digest of Technical Papers (ISSCC), 2012 IEEE International, pp. 334-336.

(Continued)

*Primary Examiner* — Douglas W Owens
*Assistant Examiner* — James H Cho
(74) *Attorney, Agent, or Firm* — Arent Fox LLP

(57) ABSTRACT

A signal transmission circuit includes a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to a transmission line; and first voltage sources that supply operating voltages to the driver circuit so as to adjust amplitudes of the complementary voltages output from the driver circuit to the transmission line.

6 Claims, 19 Drawing Sheets

(56) References Cited

FOREIGN PATENT DOCUMENTS

JP 4267655 B2 2/2009
JP 2009-200651 A 9/2009

OTHER PUBLICATIONS

Koji Fukuda et al., "A 12.3mW 12.5Gb/s Complete Transceiver in 65nm CMOS", Solid-State Circuits Conference Digest of Technical Papers (ISSCC), 2010 IEEE International, pp. 368-369.

Mike Hardwood et al., "A 225mW 28Gb/s SerDes in 40nm CMOS With 13dB of Analog Equalization for 100GBASE-LR4 and Optical Transport Lane 4.4 Applications", Solid-State Circuits Conference Digest of Technical Papers (ISSCC), 2012 IEEE International, pp. 326-327.

Wayne D. Dettoll et al., "A 32Mw 7.4Gb/s Protocol-Agile Source-Series-Terminated Transmtter in 45nm CMOS SOI", Solid-State Circuits Conference Digest of Technical Papers (ISSCC), 2010 IEEE International, pp. 370-371.

* cited by examiner

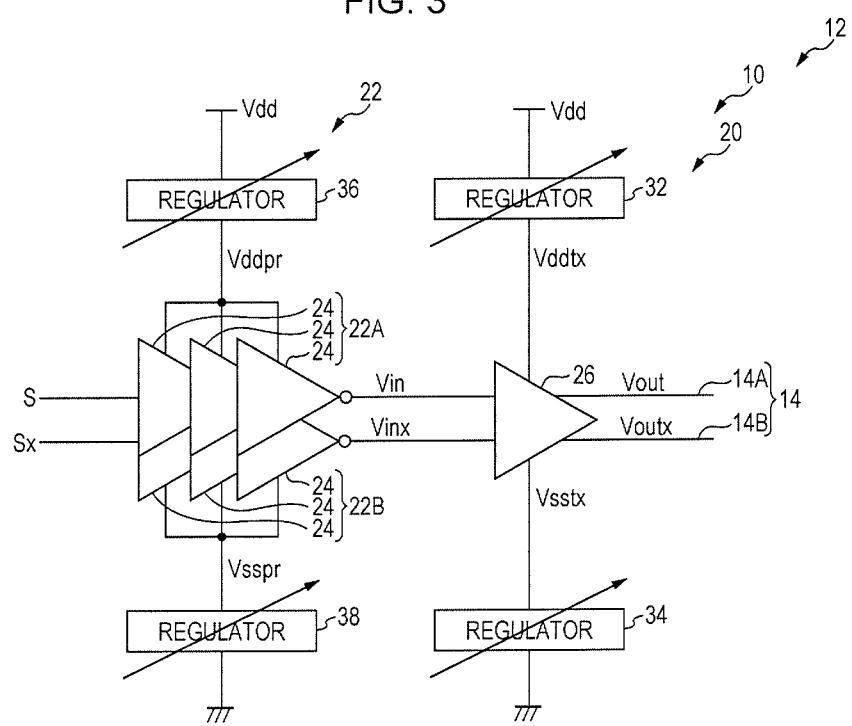

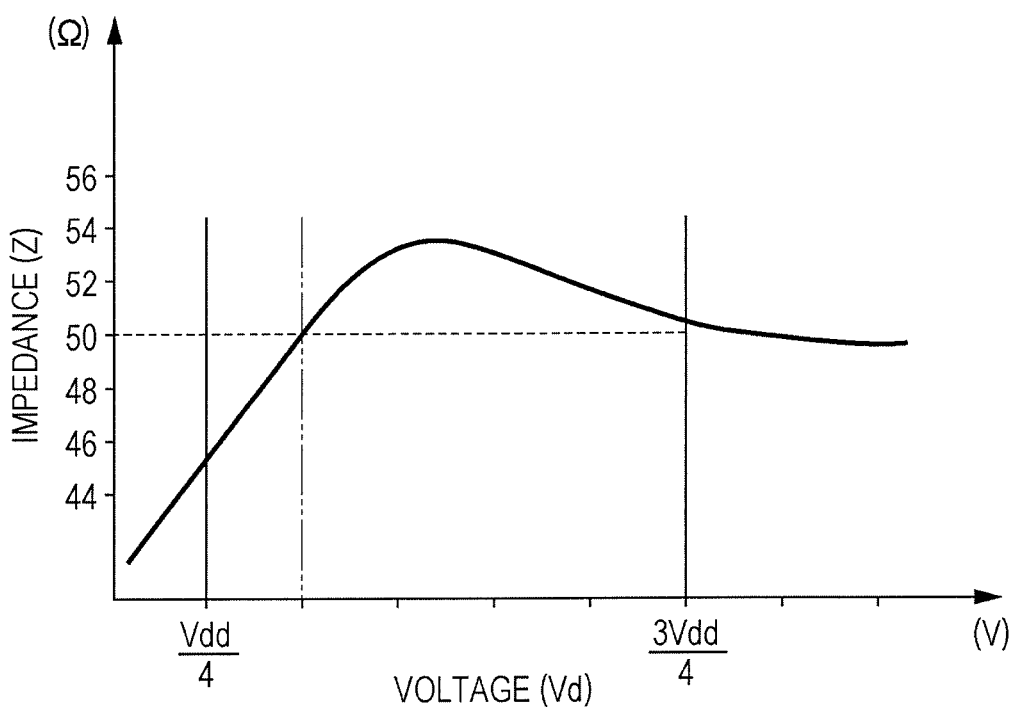

SIGNAL TRANSMISSION CIRCUIT, SIGNAL TRANSMISSION SYSTEM, AND SIGNAL TRANSMISSION METHOD

CROSS-REFERENCE TO RELATED APPLICATION

This application is based upon and claims the benefit of priority of the prior Japanese Patent Application No. 2012-143319, filed on Jun. 26, 2012, the entire contents of which are incorporated herein by reference.

FIELD

The embodiments discussed herein are related to a signal transmission circuit, a signal transmission system, and a signal transmission method.

BACKGROUND

Semiconductor integrated circuits, such as large scale integrated circuits (LSIs), each include an interface for data transmission, which includes at least one of a transmission circuit and a reception circuit. This interface is used for short-distance data communication performed inside the LSI, performed with another LSI mounted on the same circuit board, and so forth. The interface included in the LSI is also used for long-or-middle-distance data communication performed with another circuit board, performed with a daughter card connected to a circuit board having this LSI mounted thereon via a backplane, performed between a server including a circuit board having this LSI mounted thereon and another server, and so forth.

To improve the transmission accuracy of data transmission, it is desirable that an output impedance of a transmission circuit, a characteristic impedance of a transmission line, and an input impedance of a reception circuit match one another. Accordingly, there has been proposed an output buffer circuit in which a bridge circuit including switches that are switched in accordance with data to be transmitted is provided between a transmission line and a power supply and in which the bridge circuit and the power supply are connected to each other via an impedance element.

In this proposal, a replica of the output buffer circuit is provided. An output impedance of the replica is adjusted to match the characteristic impedance of the transmission line. Based on this adjustment result, an impedance of the output buffer circuit is adjusted. In this way, the output impedance of the output buffer circuit is adjusted to match the characteristic impedance of the transmission line in the above proposal.

Recently, a higher data transmission speed and a lower power consumption have been demanded. Accordingly, there has been proposed a configuration in which a plurality of differential output circuits are connected in series between a power supply line and a ground line. With this configuration, for example, by connecting three differential output circuits in series, the power consumption is reduced to ⅓ of the power consumed when power is individually supplied to the differential output circuits.

Differential transmission circuits that operate in accordance with current mode logic (CML) are typical transmission circuits to be connected to transmission lines. Output impedances of these differential transmission circuits are determined by resistances of terminating resistors that are connected to transistors. It is therefore difficult to adjust the output impedances.

Accordingly, there has been proposed an interface circuit that operates in accordance with CML and that includes a terminating resistor circuit using a symmetric load which includes a pair of transistors having the same conductivity type and a terminating resistor circuit using a transfer gate. In this proposal, the output impedance is adjusted by selectively using the terminating resistor circuit that uses a symmetric load and the terminating resistor circuit that uses a transfer gate.

The related art is described, for example, in Japanese National Publication of International Patent Application No. 2001-500326, Japanese Laid-open Patent Publication No. 2009-200651, and Japanese Laid-open Patent Publication No. 2002-185300.

However, in transmission circuits that operate in accordance with CML, it is desirable that a certain current flows through transistors serving as current sources. This makes it difficult to reduce the power consumption of the transmission circuits.

SUMMARY

According to an aspect of the embodiments, a signal transmission circuit includes a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to a transmission line; and first voltage sources that supply operating voltages to the driver circuit so as to adjust amplitudes of the complementary voltages output from the driver circuit to the transmission line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates a signal transmission circuit according to the first embodiment;

FIG. 5 illustrates an impedance of a terminating resistor switch against a voltage applied to the terminating resistor switch;

DESCRIPTION OF EMBODIMENTS

COMPARATIVE EXAMPLE

Figure 18:
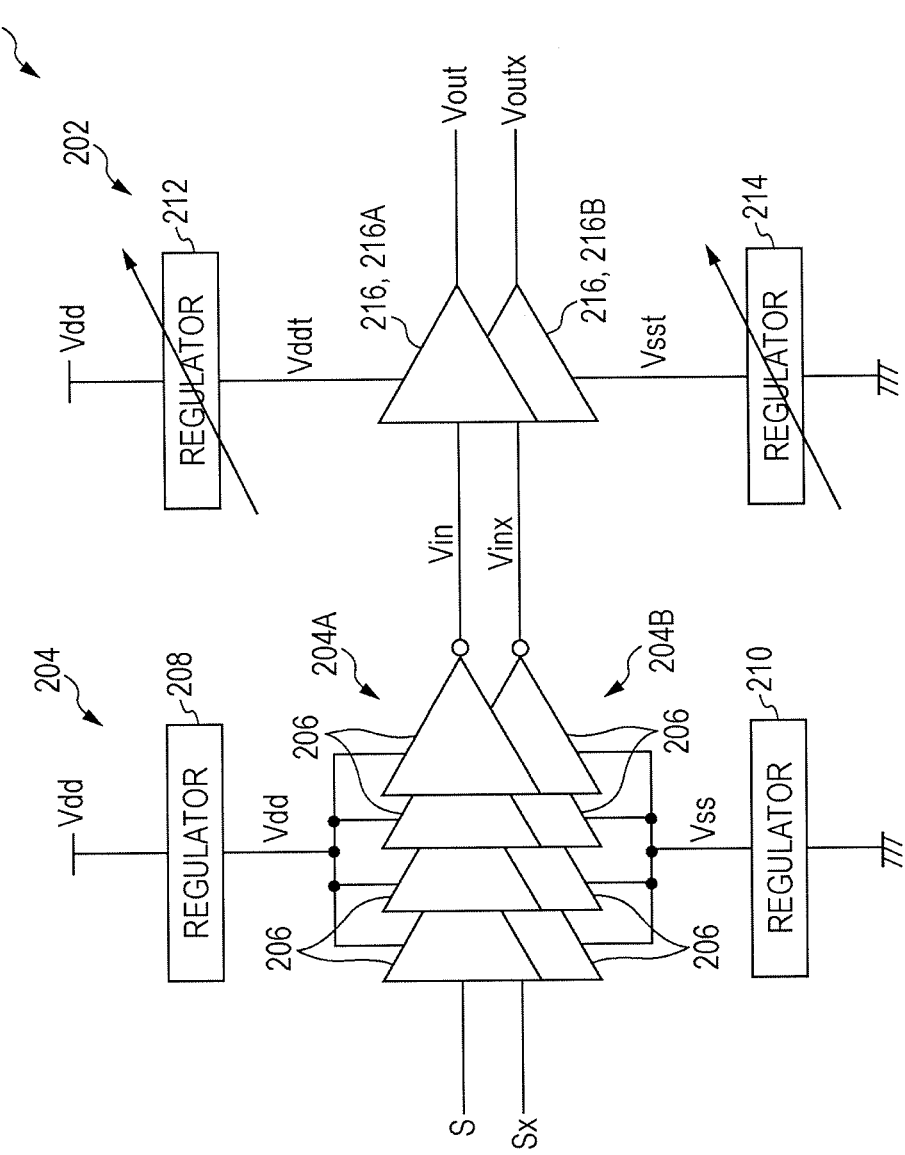
FIG. 18 illustrates a signal transmission circuit of a comparative example.

Prior to a description of embodiments of the technique disclosed herein, a comparative example of the technique disclosed herein will be described. FIG. 18 illustrates an example of a signal transmission circuit 200 according to this comparative example. This signal transmission circuit 200 includes a final driver unit (hereinafter, referred to as a driver unit) 202 that outputs transmission signals to a transmission line, and a pre-driver unit 204 that outputs voltages based on the transmission signals to the driver unit 202. The signal transmission circuit 200 outputs transmission signals using a differential transmission method. Accordingly, a transmission signal S obtained by converting parallel data to be transmitted into serial data and a transmission signal Sx having a phase opposite to that of the transmission signal S are input to the pre-driver unit 204.

The pre-driver unit 204 includes a pre-driver 204A that handles the transmission signal S and a pre-driver 204B that handles the transmission signal Sx. The pre-drivers 204A and 204B, in each of which a plurality of inverters 206 are connected in series, operate in accordance with a voltage Vdd supplied from a regulator 208 and a voltage Vss supplied from a regulator 210.

With this configuration, the pre-driver unit 204 outputs from the pre-driver 204A a voltage Vin that is based on the transmission signal S and outputs from the pre-driver 204B a voltage Vinx that is based on the transmission signal Sx.

The driver unit 202 includes regulators 212 and 214 and is driven in accordance with a voltage Vddt output from the regulator 212 and a voltage Vsst output from the regulator 214. This driver unit 202 includes driver circuits 216 each functioning as an inverter. The driver circuits 216 operate in accordance with the voltages Vin and Vinx and output voltages Vout and Voutx. The voltages Vddt and Vsst respectively output from the regulators 212 and 214 are variable. In the driver unit 202, amplitudes (voltage levels) of the voltages Vout and Voutx are controlled in accordance with the voltages Vddt and Vsst output from the regulators 212 and 214, respectively. Also, the regulators 208, 210, 212, and 214 each have a function of suppressing occurrence of noise, such as spike noise.

Figure 19:
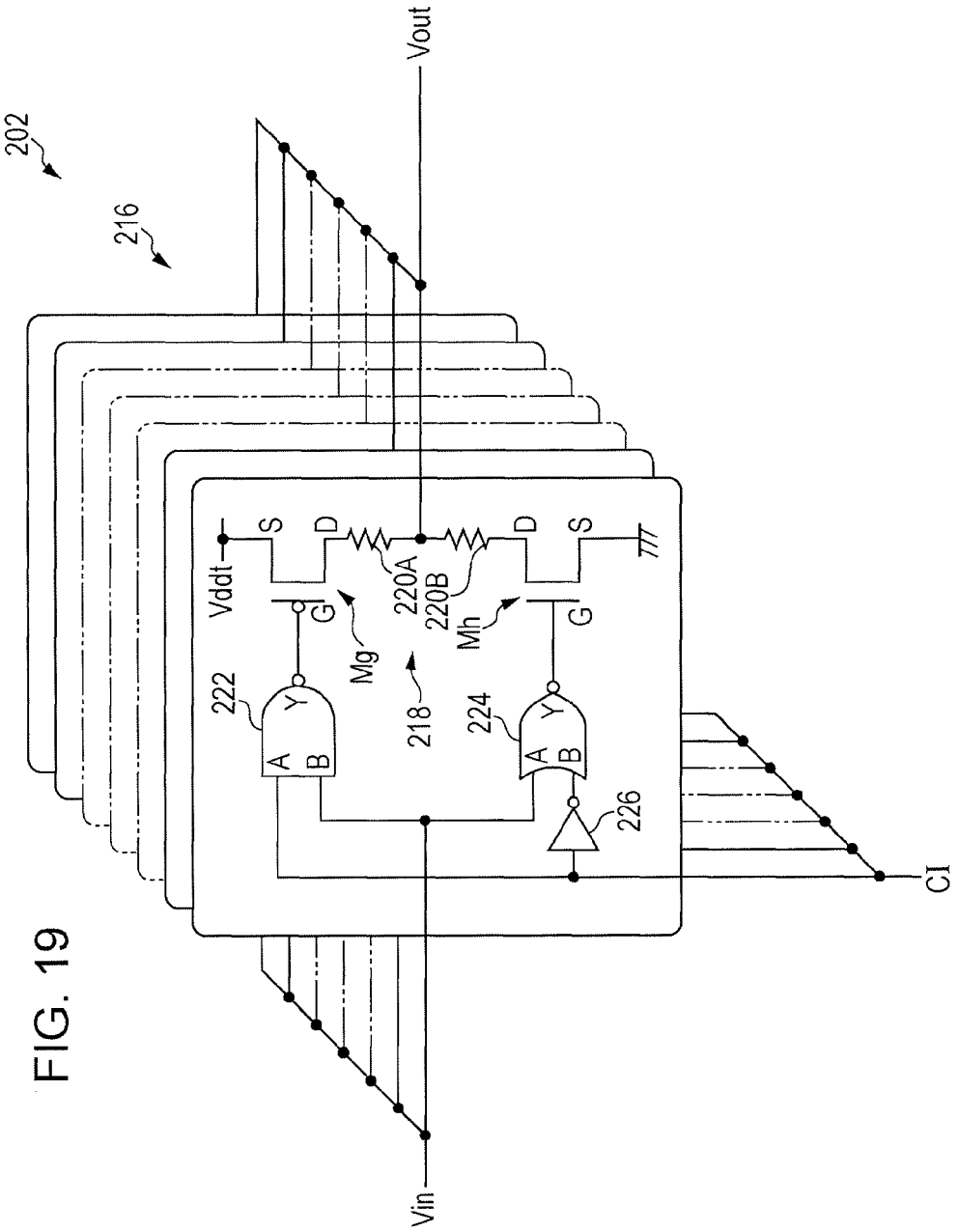
FIG. 19 illustrates a driver circuit of the comparative example.

FIG. 19 illustrates the driver circuit 216 of the signal transmission circuit 200. As illustrated in FIG. 18, the signal transmission circuit 200 includes, as the driver circuits 216, a driver circuit 216A that outputs the voltage Vout corresponding to the transmission signal S and a driver circuit 216B that outputs the voltage Voutx corresponding to the transmission signal Sx. Because the driver circuits 216A and 216B have substantially the same basic configuration, the driver circuit 216A will be described as an example of the driver circuits 216 below.

As illustrated in FIG. 19, the driver unit 202 uses, in the driver circuit 216, a source series terminated (SST) circuit 218 that operates in the voltage mode. The SST circuit 218 includes a transistor Mg and a transistor Mh. Here, a p-channel metal oxide semiconductor (PMOS) transistor is used as the transistor Mg, whereas an n-channel MOS (NMOS) transistor is used as the transistor Mh.

In the SST circuit 218, the voltage Vddt is applied to a source S of the transistor Mg and a source S of the transistor Mh is grounded. The SST circuit 218 also includes resistors 220A and 220B, which are connected in series between a drain D of the transistor Mg and a drain D of the transistor Mh.

With this configuration, the SST circuit 218 functions as an inverter. When the voltage Vin is input to gates G of the transistors Mg and Mh, the SST circuit 218 outputs the voltage Vout, which is based on the voltage Vin, from a node of the resistors 220A and 220B. At this time, as illustrated in FIG. 18, the driver circuit 216A outputs the voltage Vout based on the voltage Vin, whereas the driver circuit 216B outputs the voltage Voutx based on the voltage Vinx.

As illustrated in FIG. 19, in the SST circuit 218, the resistor 220A is connected to the transistor Mg and the resistor 220B is connected to the transistor Mh. An output impedance of the SST circuit 218 is determined by resistances (hereinafter, referred to as on-resistances) of the operating transistors Mg and Mh and resistances of the resistors 220A and 220B.

In the SST circuit 218, the transistors Mg and Mh have transistor sizes that match each other and the resistors 220A and 220B have resistances that match each other. When a characteristic impedance Zo of a transmission line is, for example, 50 Ω, an impedance Zu caused by the transistor Mg and the resistor 220A and an impedance caused by the transistor Mh and the resistor 220B are desirably set to be close to 50 Ω.

However, the on-resistances of the transistors Mg and Mh and the resistances of the resistors 220A and 220B possibly vary because of the fabrication process. Also, the on-resistances of the transistors Mg and Mh possibly change depending on a voltage applied across the drain D and the source S (across the source S and the drain D regarding the transistor Mg). Because of these reasons, the output impedance of the SST circuit 218 and a desired impedance (for example, 50 Ω) possibly mismatch.

An increase in the transistor size lowers the on-resistances of the transistors Mg and Mh. Accordingly, a change in the impedance resulting from variations of the transistors Mg and Mh may be suppressed by increasing the transistor sizes of the transistors Mg and Mh. However, this does not achieve impedance matching between the output impedance of the SST circuit 218 and the characteristic impedance of the transmission line.

Accordingly, in the driver unit 202 of the signal transmission circuit 200, the driver circuit 216 includes a plurality of SST circuits 218 arranged in parallel and adjusts the number of SST circuit 218 to operate, thereby adjusting the output impedance to match the characteristic impedance. In the driver circuit 216, a NAND circuit (hereinafter, referred to as a NAND) 222 and a NOR circuit (hereinafter, referred to as NOR) 224 are provided for each SST circuit 218. An output terminal of the NAND 222 is connected to the gate G of the transistor Mg, whereas an output terminal of the NOR 224 is connected to the gate G of the transistor Mh. Also, the voltage Vin is input to one of input terminals of each of the NAND 222 and the NOR 224.

Also, a control signal CI for controlling the output impedance of the driver circuit 216 is input to the driver unit 202. In each SST circuit 218, the control signal CI is input to the NAND 222 and is input to the NOR 224 via an inverter 226.

With this configuration, in the driver circuit 216, the voltage Vin is input to the SST circuits 218 selected in accordance with the control signal CI and the selected SST circuits 218 operate. At this time, a total impedance of impedances of the operating SST circuits 218 serves as the output impedance of the driver circuit 216.

Thus, the signal transmission circuit 200 successfully reduces the power consumption by using the driver circuits 216 each including the SST circuits 218 that operate in the voltage mode, compared with the power consumption in the case of using driver circuits that operate in the current mode (CML). Also, the signal transmission circuit 200 successfully adjusts the output impedance to match the characteristic impedance of the transmission line by adjusting the number of SST circuits 218 connected in parallel.

In the signal transmission circuit 200, the transistor size may be reduced by using the transistors Mg and Mh having large on-resistances relative to resistances of the resistors 220A and 220B. On the other hand, in the driver circuit 216, the plurality of SST circuits 218 are connected in parallel. Thus, even the transistors Mg and Mh having small transistor sizes are used, the appearance transistor size of the driver circuit 216 increases. Also, the pre-driver unit 204 is desirably formed in accordance with the transistor size of the driver circuit 216 in the signal transmission circuit 200. Specifically, in the pre-drivers 204A and 204B, the transistor sizes of the inverters 206 are increased gradually to make the transistor size of the inverter 206 on the final stage match the transistor sizes of the transistors Mg and Mh included in the driver circuits 216A and 216B.

In the case of gradually increasing the transistor sizes of the inverters 206, the operation speed of the inverters 206 decreases if a ratio between the transistor size of the inverter 206 on the preceding stage and the transistor size of the inverter 206 on the following stage is large. To gradually increase the transistor sizes while suppressing a decrease in the operation speed, the ratio between the transistor size of the inverter 206 on the preceding stage and the transistor size of the inverter 206 on the following stage is desirably set to be small (for example, 1.5 or less). As a result, the number of inverters 206 included in each of the pre-drivers 204A and 204B increases if the driver circuit 216 has a large transistor size.

The number of SST circuits 218 included in each of the driver circuits 216 and the number of inverters 206 included in each of the pre-drivers 204A and 204B of the pre-driver unit 204 disturb a reduction in the power consumption of the signal transmission circuit 200. Consequently, the signal transmission circuit 200 succeeds in reducing the power consumption by using the SST circuits 218 that operate in the voltage mode compared with the case of using driver circuits that operate in the current mode but the amount of power consumption to be reduced is limited.

Now, an example of a first embodiment of the technique disclosed herein will be described in detail with reference to the accompanying drawings.

Figure 2:
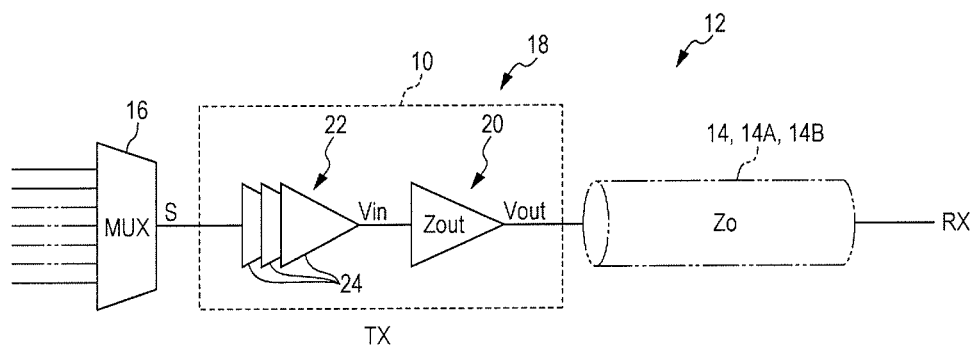
FIG. 2 schematically illustrates a signal transmission system according to the first embodiment.

FIG. 2 illustrates a signal transmission circuit 10 (TX) according to the first embodiment. The signal transmission circuit 10 is an example of a signal transmission circuit used in the technique disclosed herein. The signal transmission circuit 10 is included in a signal transmission system 12 and is connected to one end of a transmission line 14. The signal transmission system 12 functions as an example of a signal transmission system used in the technique disclosed herein. The transmission line 14 functions as an example of a transmission line used in the technique disclosed herein. The other end of the transmission line 14 is connected to a reception circuit (RX).

The signal transmission system 12 includes, for example, a multiplexer (MUX) 16. The MUX 16 converts parallel data to be transmitted into serial data to generate a transmission signal S and inputs the generated transmission signal S to the signal transmission circuit 10. The signal transmission circuit 10 outputs a voltage Vout that is based on the input transmission signal S to the transmission line 14.

In the signal transmission system 12, the signal transmission circuit 10 is provided in a semiconductor integrated circuit (hereinafter, referred to as an LSI) 18, such as an LSI or a very large-scale integrated circuit (VLSI). Using the signal transmission circuit 10, the signal transmission system 12 transmits the transmission signal S inside the LSI 18, inside a circuit board having the LSI 18 mounted thereon, and between a circuit board having the LSI 18 mounted thereon and another circuit board, and so forth. Also, the signal transmission system 12 may be used for signal transmission performed between an apparatus, such as a server, including the LSI 18 therein and another apparatus, such as a server. That is, the signal transmission circuit 10 of the signal transmission system 12 functions as a part of an interface that connects various functional components to each other.

FIG. 3 illustrates an example of the signal transmission circuit 10. In the technique disclosed herein, complementary transmission signals S are transmitted using the differential transmission method. The signal transmission system 12 uses, as the complementary transmission signals S, a transmission signal S and a transmission signal Sx having a phase opposite to that of the transmission signal S. The transmission signals S and Sx are input to the signal transmission circuit 10.

This signal transmission circuit 10 includes a final driver unit (hereinafter, referred to as a driver unit) 20 and a pre-driver unit 22. In this signal transmission circuit 10, the transmission signals S and Sx are input to the pre-driver unit 22. The pre-driver unit 22 includes a predetermined number of inverters 24, which are connected in series. The pre-driver unit 22 includes a pre-driver 22A that handles the transmission signal S and a pre-driver 22B that handles the transmission signal Sx. The pre-drivers 22A and 22B function as an example of pre-drivers used in the technique disclosed herein.

The pre-driver unit 22 outputs voltages that are based on the transmission signals S and Sx to the driver unit 20. In each of the pre-drivers 22A and 22B, a plurality of inverters 24 are connected in series and the transistor sizes of the inverters 24 are gradually increased. With this configuration, the pre-drivers 22A and 22B perform buffering in accordance with the transistor size of the driver unit 20, which will be described later, while suppressing a decrease in the transmission speed.

The voltages output from the pre-driver unit 22 are input to the driver unit 20. In the following description, the voltages input to the driver unit 20 are referred to as voltages Vin and Vinx. The driver unit 20 outputs voltages Vout and Voutx that are based on the input voltages Vin and Vinx to a pair of transmission lines 14A and 14B, respectively, which is provided as the transmission line 14.

Figure 1:
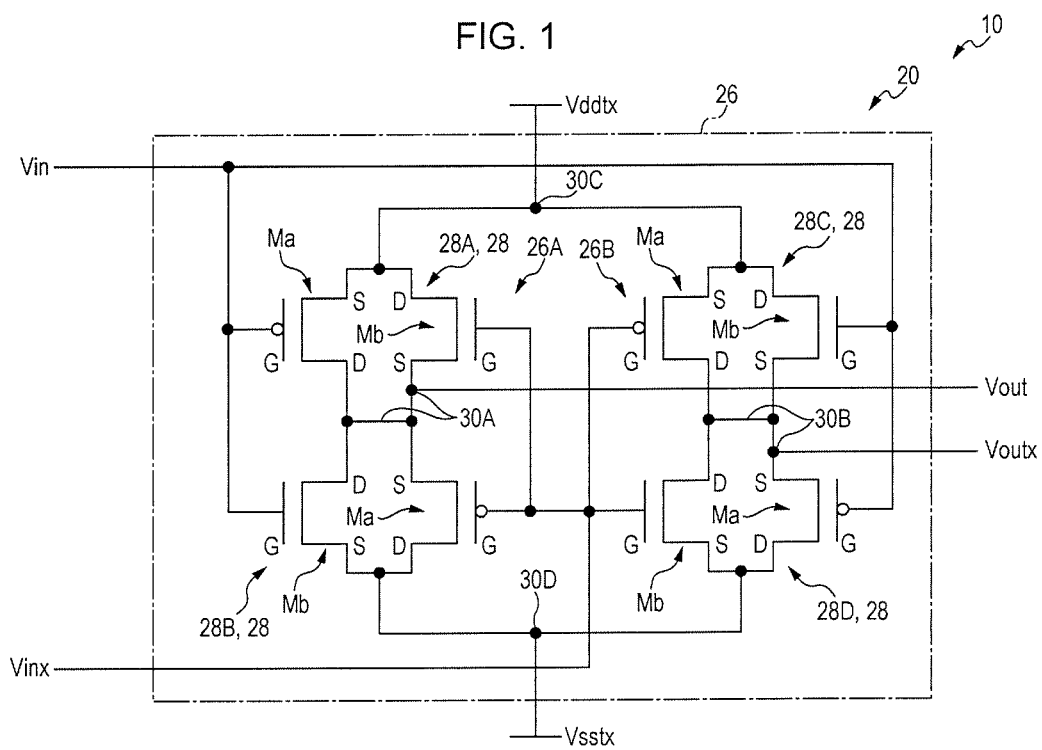
FIG. 1 illustrates components of a driver circuit according to a first embodiment.

FIG. 1 illustrates an example of the driver unit 20 included in the signal transmission circuit 10. The driver unit 20 includes a driver circuit 26 that uses symmetric loads. The driver circuit 26 functions as an example of a driver circuit used in the technique disclosed herein.

The driver circuit 26 includes four terminating resistor switches 28A, 28B, 28C, and 28D (hereinafter, collectively referred to as terminating resistor switches 28 when they are mentioned collectively). The terminating resistor switches 28 function as an example of transistor switches used in the technique disclosed herein. Each of the terminating resistor switches 28 includes a pair of transistors Ma and Mb. A PMOS transistor is used as the transistor Ma, whereas an NMOS transistor is used as the transistor Mb.

While a description will be given below using a PMOS transistor and an NMOS transistor, two PMOS transistors or two NMOS transistors may be used in the technique disclosed herein. That is, transistors having the same conductivity type or different conductivity types may be used as the pair of transistors in the technique disclosed herein.

In the technique disclosed herein, the transistors having the same conductivity type imply that if one of the pair of transistors is a PMOS transistor, the other of the pair of transistors is also a PMOS transistor and that if one of the pair of transistors is an NMOS transistor, the other of the pair of transistors is also an NMOS transistor. Also, the transistors having different conductivity types imply that if one of the pair of transistors is a PMOS transistor, the other of the pair of transistors is an NMOS transistor. Also, the conductivity type implies the polarity of a channel. The same conductivity type implies that polarities of channels are the same, whereas the different conductivity types imply that polarities of channels are different.

In each of the terminating resistor switches 28, a source S of the transistor Ma is connected to a drain D of the transistor Mb and a drain D of the transistor Ma is connected to a source S of the transistor Mb. In the driver circuit 26, the terminating resistor switches 28A and 28B are connected in series (hereinafter, a node therebetween is referred to as a node 30A) and the terminating resistor switches 28C and 28D are connected in series (hereinafter, a node therebetween is referred to as a node 30B).

Also in the driver circuit 26, the terminating resistor switches 28A and 28B are connected to the terminating resistor switches 28C and 28D in parallel. In this manner, the four terminating resistor switches 28A, 28B, 28C, and 28D are connected to form a bridge in the driver circuit 26. The driver circuit 26 includes an inverter 26A constituted by the terminating resistor switches 28A and 28B, and an inverter 26B constituted by the terminating resistor switches 28C and 28D. The inverters 26A and 26B function as complementary inverters. Hereinafter, a node between the terminating resistor switches 28A and 28C on the pull-up side is referred to as a node 30C, whereas a node between the terminating resistor switches 28B and 28D on the pull-down side is referred to as a node 30D.

Connection in series indicates connecting the drain D of the transistor Ma and the source S of the transistor Mb of the terminating resistor switch 28A to the drain D of the transistor Mb and the source S of the transistor Ma of the terminating resistor switch 28B, respectively. Connection in series also indicates connecting the drain D of the transistor Ma and the source S of the transistor Mb of the terminating resistor switch 28C to the drain D of the transistor Mb and the source S of the transistor Ma of the terminating resistor switch 28D, respectively. Connection in parallel indicates connecting the source S of the transistor Ma and the drain D of the transistor Mb of the terminating resistor switch 28A to the source S of the transistor Ma and the drain D of the transistor Mb of the terminating resistor switch 28C. Connection in parallel also indicates connecting the drain D of the transistor Ma and the source S of the transistor Mb of the terminating resistor switch 28B to the drain D of the transistor Ma and the source S of the transistor Mb of the terminating resistor switch 28D.

In each of the terminating resistor switches 28, the transistors Ma and Mb are connected in parallel. This configuration allows each of the terminating resistor switches 28 to function as a switch in response to input of complementary signals to gates G of the transistors Ma and Mb. Internal resistances (on-resistances) of the transistors Ma and Mb caused when the transistors Ma and Mb perform an on-operation (operate as switches) serve as an impedance of each of the terminating resistor switches 28.

Accordingly, each of the terminating resistor switches 28 functions as a so-called symmetric load that uses the transistors Ma and Mb. The driver circuit 26 using these terminating resistor switches 28 functions as a driver circuit of a symmetric load type.

In the driver circuit 26, a voltage Vddtx is supplied to the node 30C and a voltage Vsstx is supplied to the node 30D. In the driver circuit 26, the voltage Vin is input to the gates G of the transistors Ma of the terminating resistor switches 28A and 28D and the voltage Vinx is input to the gates G of the transistors Mb of the terminating resistor switches 28A and 28D. Also in the driver circuit 26, the voltage Vinx is input to the gates G of the transistors Ma of the terminating resistor switches 28B and 28C and the voltage Vin is input to the gates G of the transistors Mb of the terminating resistor switches 28B and 28C.

With this configuration, the driver circuit 26 outputs from the node 30A the voltage Vout that is based on the voltage Vin and outputs from the node 30B the voltage Voutx that is based on the voltage Vinx.

Referring now to FIGS. 4A to 4D, operations of the transistors Ma and Mb (hereinafter, referred to as an on-operation of the terminating resistor switch 28) performed when each of the terminating resistor switches 28 functions as a symmetric load.

Figure 4A:
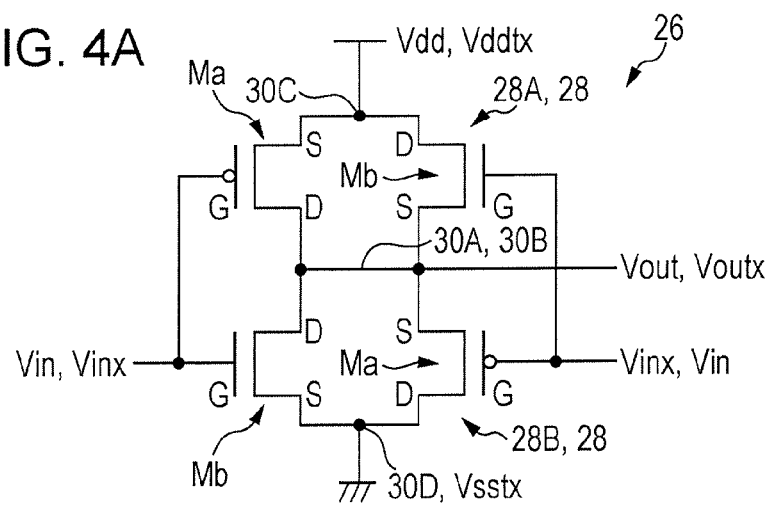
FIG. 4A illustrates terminating resistor switches connected in series.
Figure 4B:
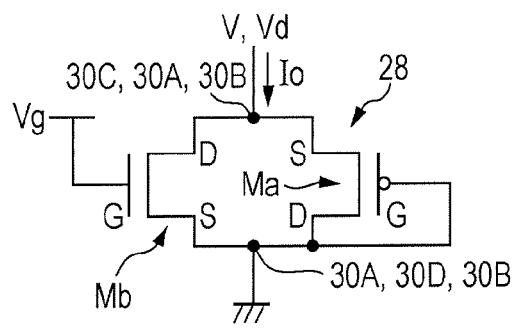
FIG. 4B illustrates one terminating resistor switch.

FIG. 4A illustrates the terminating resistor switch 28A on the pull-up side and the terminating resistor switch 28B on the pull-down side that output the voltage Vout. FIG. 4B illustrates one terminating resistor switch 28. When the terminating resistor switch 28 performs the on-operation in response to the complementary voltages Vin and Vinx, the transistor Mb operates in a triode region. Also, when the terminating resistor switch 28 performs the on-operation, the gate G of the transistor Ma is grounded and the transistor Ma operates in a saturation region.

Figure 4C:
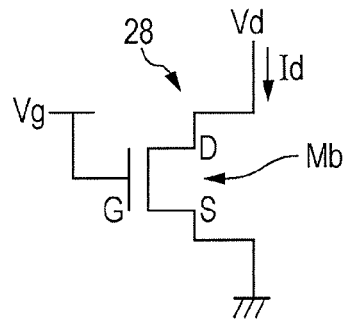
FIG. 4C illustrates a transistor that operates in a triode region.
Figure 4D:
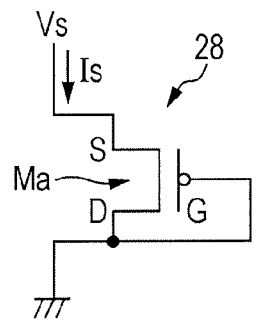
FIG. 4D illustrates a transistor that operates in a saturation region.

As illustrated in FIG. 4D, when operating in the saturation region, the transistor Ma functions as a two-terminal electronic element (diode). At this time, let $\beta_p$ denote a current amplification of the transistor Ma and let $V_{thp}$ denote a threshold voltage of the transistor Ma. Then, a source current $I_s$ is expressed by Equation (1) because the gate G is grounded and a source voltage $V_s$ exceeds the threshold $V_{thp}$.

$$I_s = \frac{\beta_p}{2}(V_S - |V_{thp}|)^2 \quad (1)$$

Also, as illustrated in FIG. 4C, when operating in the triode region, the transistor Mb functions as a three-terminal electronic element (triode). At this time, let $\beta_n$ denote a current amplification of the transistor Mb and let $V_{thn}$ denote a threshold voltage of the transistor Mb. Then, a drain current $I_d$ is expressed by Equation (2).

$$I_d = \beta_n[(V_{dd} - V_{thn})V_d - \tfrac{1}{2}V_d^2] \quad (2)$$

As illustrated in FIG. 4B, the terminating resistor switch 28 is constituted by the transistors Ma and Mb that are connected in parallel. If the transistor sizes of the transistors Ma and Mb are adjusted to match each other, a current amplification $\beta$ satisfies a relationship expressed as $\beta = \beta_p = \beta_n$. When a voltage at the node 30C is denoted by V, a relationship $V = V_d$ is satisfied in the transistor Mb. Also, a voltage of the transistor Ma is denoted as $V = V_s - |V_{thp}|$ from Equation (1), where "$|V_{thp}|$" represents an absolute value of the threshold voltage $V_{thp}$.

Based on the foregoing, $(V_s - |V_{thp}|) = V_d$ is substituted into Equation (1). Then, a current $I_o$ is expressed by Equation (3).

$$I_0 = I_d + I_s = \beta_n(V_{dd} - V_{thn})V_d \quad (3)$$

Accordingly, when the terminating resistor switch 28 performs the on-operation, the impedance between the nodes 30C and 30A is considered as a linear resistance that depends on the voltage Vd and a gate voltage Vg of the transistor Mb. The same applies to the impedance between the nodes 30C and 30B, the impedance between the nodes 30A and 30D, and the impedance between the nodes 30B and 30D.

Accordingly, an impedance Zu of the terminating resistor switch 28A on the pull-up side and an impedance Zd of the terminating resistor switch 28B on the pull-down side change depending on the voltage Vdd.

Consequently, an output impedance Zout of the driver circuit 26 illustrated in FIG. 1 changes depending on the voltages Vddtx and Vsstx. Also, the output impedance Zout of the driver circuit 26 changes depending on voltage levels of the voltages Vin and Vinx that are input to the gates G of the respective transistors Mb.

As illustrated in FIG. 3, the driver unit 20 includes a regulator 32 and a regulator 34. The regulators 32 and 34 function as an example of first voltage sources used in the technique disclosed herein. The regulator 32 is provided on a power supply voltage Vdd side of the driver circuit 26 and outputs the voltage Vddtx serving as an operating voltage to the driver circuit 26. The regulator 34 is provided on a ground side of the driver circuit 26 and outputs the voltage Vsstx serving as another operating voltage to the driver circuit 26.

In the signal transmission circuit 10, the driver circuit 26 operates in the voltage mode in accordance with the voltage Vddtx output by the regulator 32 and the voltage Vsstx output by the regulator 34.

The pre-driver unit 22 includes a regulator 36 and a regulator 38. The regulators 36 and 38 function as an example of second voltage sources used in the technique disclosed herein. The regulator 36 is provided on the power supply voltage Vdd side of the pre-drivers 22A and 22B and outputs a certain voltage Vddpr to the pre-drivers 22A and 22B. The regulator 38 is provided on the ground side of the pre-drivers 22A and 22B and outputs a certain voltage Vsspr serving as an operating voltage to the pre-drivers 22A and 22B. In the pre-drivers 22A and 22B, the inverters 24 operate in accordance with the voltage Vddpr output by the regulator 36 and the voltage Vsspr output by the regulator 38.

The signal transmission circuit 10 uses variable regulators capable of changing output voltage, as the regulators 32 and 34 of the driver unit 20 and the regulators 36 and 38 of the pre-driver unit 22. As a variable regulator, a general configuration may be used which uses a differential amplifier circuit, such as an operational amplifier, and a comparator and which performs control in accordance with an output voltage fed back thereto so as to adjust the output voltage to match a reference voltage.

In the signal transmission circuit 10 according to the first embodiment, the voltage Vddpr output from the regulator 36 and the voltage Vsspr output from the regulator 38 are adjusted in advance. Also, in the signal transmission circuit 10, the voltage Vddtx output from the regulator 32 and the voltage Vsstx output from the regulator 34 are adjusted. In the signal transmission circuit 10, amplitudes of the voltages Vout and Voutx output by the driver unit 20 (the driver circuit 26) are adjusted in accordance with the voltage Vddtx output from the regulator 32 and the voltage Vsstx output from the regulator 34. Moreover, in the signal transmission circuit 10, the voltage Vddpr output from the regulator 36 and the voltage Vsspr output from the regulator 38 are adjusted such that the output impedance Zout of the driver unit 20 (the driver circuit 26) matches the characteristic impedance Zo of the transmission line 14.

An operation according to the first embodiment will be described below.

In the signal transmission circuit 10 used in the signal transmission system 12, the differential transmission signals S and Sx are input to the pre-drivers 22A and 22B, respectively. The pre-driver 22A buffers the input transmission signal S using the inverters 24 and outputs the voltage Vin. The pre-driver 22B buffers the input transmission signal Sx using the inverters 24 and outputs the voltage Vinx.

In the driver unit 20, the terminating resistor switches 28A to 28D included in the driver circuit 26 are switched in response to input of the voltages Vin and Vinx in accordance with the voltages Vin and Vinx. As a result, the driver unit 20 outputs the voltages Vout and Voutx that are based on the transmission signals S and Sx to the transmission line 14 (the transmission lines 14A and 14B) from the driver circuit 26, respectively. At this time, in the driver unit 20, the driver circuit 26 operates in the voltage mode in accordance with the voltage Vddtx supplied from the regulator 32 and the voltage Vsstx supplied from the regulator 34.

Voltage levels of the voltages Vin and Vinx that are output by the pre-driver unit 22 in accordance with the transmission signals S and Sx are determined by the voltage Vddpr output from the regulator 36 and the voltage Vsspr output from the regulator 38.

Also, voltage levels of the voltages Vout and Voutx output from the driver circuit 26 of the driver unit 20 are determined by the voltage Vddtx input from the regulator 32 and the voltage Vsstx input from the regulator 34.

In the driver circuit 26, an impedance Z of each of the terminating resistor switches 28 changes in accordance with the voltages Vddpr and Vsspr. FIG. 5 illustrates an example of a change in the impedance Z of the terminating resistor switch 28 against the voltage Vd applied to the terminating resistor switch 28. Note that, in the driver circuit 26 in which the terminating resistor switches 28A to 28D are connected to form a bridge, a voltage at the node 30A or 30B (the voltage Vout or Voutx) corresponds to the voltage Vd. In FIG. 5, a relationship Vdd=Vddtx−Vsstx is satisfied.

The voltage Vd of the driver circuit 26 that operates in the voltage mode is variably set in a range from ¼ of the voltage Vdd to ¾ of the voltage Vdd. Also, the voltage Vd is changed using the voltage Vddtx output from the regulator 32 and the voltage Vsstx output from the regulator 34. The transistor sizes of the transistors Ma and Mb used in the driver circuit 26 are set so that the impedance Z of the terminating resistor switch 28 is within a certain range (for example, 50 Ω±10%) in the variable range of the voltage Vd. That is, the driver unit 20 adjusts the voltage Vddtx output from the regulator 32 and the voltage Vsstx output from the regulator 34 in accordance with the transistor sizes of the transistors Ma and Mb, thereby setting the variable range of the impedance Z of each of the terminating resistor switches 28. Also, the driver unit 20 adjusts the voltage Vddtx output from the regulator 32 and the voltage Vsstx output from the regulator 34, thereby adjusting amplitudes of the voltages Vout and Voutx output by the driver circuit 26 that operates in the voltage mode.

In this manner, the driver unit 20 may adjust the impedance Z of the terminating resistor switch 28A to match the characteristic impedance Zo of the transmission line 14 by, for example, controlling the voltage Vddpr.

The signal transmission circuit 10 adjusts the voltage Vddpr output from the regulator 36 and the voltage Vsspr output from the regulator 38 at a certain timing, for example, when the LSI 18 is turned on. If the output impedance Zout of the driver circuit 26 is determined depending on variations in the fabrication process of the LSI 18, the voltages Vddpr and Vsspr may be adjusted during a test that is performed before the LSI 18 is shipped.

At this time, the signal transmission circuit 10 adjusts the voltages Vddpr and Vsspr such that the impedance Z of each of the terminating resistor switches 28A to 28D matches the characteristic impedance Zo of the transmission line 14. This may suppress a decrease in the transmission efficiency caused by the output impedance Zout when the transmission signals S and Sx are transmitted using the signal transmission circuit 10.

The driver circuit 26 of the driver unit 20 operates in the voltage mode. With this configuration, the signal transmission circuit 10 may reduce the power consumption compared with the case of using driver circuits that operate in the current mode.

The signal transmission circuit 200 described above includes the driver circuits 216 each using the SST circuits 218 that operate in the voltage mode. With this configuration, the signal transmission circuit 200 reduces the power consumption compared with the case of using driver circuits that operate in the current mode. However, the signal transmission circuit 200 adjusts the output impedance by connecting the plurality of SST circuits 218 in parallel. Accordingly, the transistor size of the driver circuit 216 of the signal transmission circuit 200 is larger than the transistor size of the driver circuit 26 of the signal transmission circuit 10.

For example, suppose that the transistor size of the driver circuit 26 used in the signal transmission circuit 10 is two. Then, the transistor size of the driver circuit 216 used in the signal transmission circuit 200 is twelve (approximately six times larger).

As a result, the number of inverters 206 included in the signal transmission circuit 200 is desirably three times the number of inverters 24 included in the signal transmission circuit 10 or more in order to perform buffering while suppressing a decrease in the transmission speed.

The signal transmission circuit 10, which uses the driver circuit 26 of the symmetric load type, may reduce the power consumption to ⅕ of the power consumed by the signal transmission circuit 200 that uses the SST circuits 218 or less. Also, the signal transmission circuit 10 may reduce the power consumption by a large amount compared with a signal transmission circuit including driver circuits that operate in the current mode.

A second embodiment of the technique disclosed herein will be described next. A basic configuration of the second embodiment is substantially the same as that of the first embodiment. In the second embodiment, functional components that are similar to those of the first embodiment are assigned the same reference numerals as those of the first embodiment and a description thereof is omitted.

Figure 6:
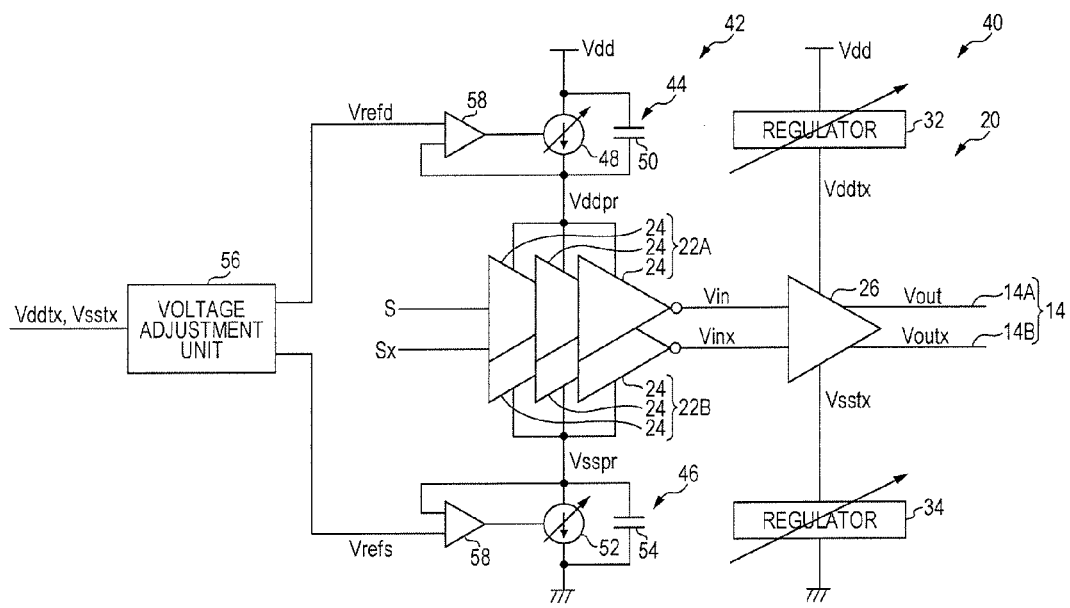
FIG. 6 illustrates a signal transmission circuit according to a second embodiment.

FIG. 6 illustrates an example of a signal transmission circuit 40 according to the second embodiment. The signal transmission circuit 40 functions as an example of a signal transmission circuit used in the technique disclosed herein. The signal transmission circuit 40 differs from the signal transmission circuit 10 in that the signal transmission circuit 40 includes a pre-driver unit 42 instead of the pre-driver unit 22.

The pre-driver unit 42 includes a regulator 44 and a regulator 46 instead of the regulator 36 and the regulator 38, respectively. The regulators 44 and 46 function as an example of second voltage sources used in the technique disclosed herein. The regulator 44 includes a current source 48 and a capacitor 50 which are connected in parallel, whereas the regulator 46 includes a current source 52 and a capacitor 54 which are connected in parallel. Currents output by the current sources 48 and 52 are variable. In the regulator 44, the capacitor 50 functions to output a voltage Vddpr in accordance with the current output by the current source 48. In the regulator 46, the capacitor 54 functions to output a voltage Vsspr in accordance with the current output by the current source 52. With this configuration, the regulators 44 and 46 output variable voltages in accordance with the currents output by the current sources 48 and 52, respectively.

The signal transmission circuit 40 according to the second embodiment also includes a voltage adjustment unit 56 that adjusts the voltages Vddpr and Vsspr output from the regulators 44 and 46, respectively. Each of the regulators 44 and 46 includes a comparator 58. In the technique disclosed herein, the comparator 58 functions as an adjustment unit and a part of a target generation unit. In the regulator 44, the voltage Vddpr output to pre-drivers 22A and 22B and a voltage Vrefd output from the voltage adjustment unit 56 are input to the comparator 58. Also in the regulator 44, the comparison result output by the comparator 58 is input to the current source 48, whereby the current output by the current source 48 changes. In this way, the regulator 44 performs control to make the voltage Vddpr substantially equal to the voltage Vrefd.

In the regulator 46, the voltage Vsspr output to the pre-drivers 22A and 22B and a voltage Vrefs output from the voltage adjustment unit 56 are input to the comparator 58. Also in the regulator 46, the comparison result output by the comparator 58 is input to the current source 52, whereby the current output by the current source 52 changes. In this way, the regulator 46 performs control to make the voltage Vsspr substantially equal to the voltage Vrefs.

Figure 7:
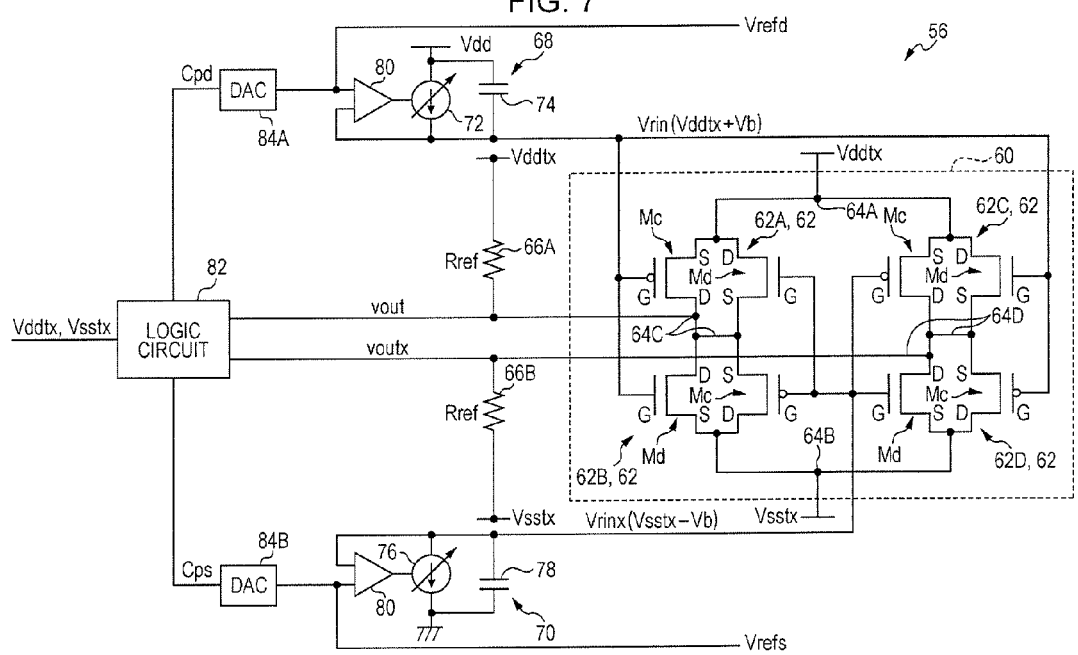
FIG. 7 illustrates a voltage adjustment unit according to the second embodiment.

FIG. 7 illustrates an example of the voltage adjustment unit 56 according to the second embodiment. The voltage adjustment unit 56 includes a switch circuit 60. This switch circuit 60 functions as an example of a replica circuit of the driver circuit 26 (see FIG. 1) included in the driver unit 20.

The switch circuit 60 includes four resistor switches 62A, 62B, 62C, and 62D (hereinafter, collectively referred to as resistor switches 62 when they are mentioned collectively). The resistor switches 62 function as an example of switches included in the replica circuit used in the technique disclosed herein. Each of the resistor switches 62 includes a transistor Mc and a transistor Md. A PMOS transistor is used as the transistor Mc, whereas an NMOS transistor is used as the transistor Md. In each of the resistor switches 62, a source S of the transistor Mc is connected to a drain D of the transistor Md and a drain D of the transistor Mc is connected to a source S of the transistor Md. This configuration allows each of the resistor switches 62 to function as a switch of a symmetric load type in response to input of complementary signals to gates G of the transistors Mc and Md.

In the switch circuit 60, the resistor switches 62A and 62B are connected in series and the resistor switches 62C and 62D are connected in series. Also, in the switch circuit 60, the resistor switches 62A and 62B are connected to the resistor switches 62C and 62D in parallel. In this manner, in the switch circuit 60, the resistor switches 62A to 62D are connected to form a bridge.

In the switch circuit 60, a voltage Vddtx (a voltage output from a regulator 32) is supplied to a node 64A between the resistor switches 62A and 62C and a voltage Vsstx (a voltage output from a regulator 34) is supplied to a node 64B between the resistor switches 62B and 62D.

In the switch circuit 60, a voltage Vrin is input to the gates G of the transistors Mc of the resistor switches 62A and 62D and the gates G of the transistors Md of the resistor switches 62B and 62C. Also, in the switch circuit 60, a voltage Vrinx is input to the gates G of the transistors Md of the resistor switches 62A and 62D and the gates G of the transistors Mc of the resistor switches 62B and 62C. In response to input of the voltages Vrin and Vrinx, the switch circuit 60 outputs a voltage vout from a node 64C between the resistor switches 62A and 62B. Also, in response to input of the voltages Vrin and Vrinx, the switch circuit 60 outputs a voltage voutx from a node 64D between the resistor switches 62C and 62D.

A resistor 66A is connected to the node 64C in the switch circuit 60. The voltage Vddtx is applied via this resistor 66A. Also, a resistor 66B is connected to the node 64D in the switch circuit 60. The voltage Vsstx is applied via this resistor 66B. The resistors 66A and 66B each have an impedance (a resistance Rref) corresponding to a characteristic impedance Zo of a transmission line 14 connected to the driver circuit 26. With this configuration, the switch circuit 60 functions as a replica of the driver circuit 26 and outputs the voltages vout and voutx corresponding to the voltages Vout and Voutx output by the driver circuit 26, respectively. The resistors 66A and 66B may be provided in the LSI 18. Alternatively, in the case where suppression of errors in the resistance Rref caused by variations in the fabrication process is considered, the resistors 66A and 66B may be provided outside the LSI 18.

The fact that the switch circuit 60 is a replica of the driver circuit 26 implies that if voltages Vin and Vinx are equal to the voltages Vrin and Vrinx, respectively, the voltages Vout and Voutx output by the driver circuit 26 are also equal to the voltages vout and voutx output by the switch circuit 60, respectively. Also, the fact that the switch circuit 60 is a replica of the driver circuit 26 implies that electric characteristics of the terminating resistor switches 28A to 28D and electric characteristics of the resistor switches 62A to 62D have proportional relationships. For example, it is implied that the transistor sizes of the transistors Mc and Md and the transistor sizes of the transistors Ma and Mb have a proportional relationship.

Accordingly, the switch circuit 60 uses the transistors Mc and Md having transistor sizes that are approximately ¼ to ⅛ of the transistor sizes of the transistors Ma and Mb of the driver circuit 26, respectively. The switch circuit 60 also uses the resistors 66A and 66B having impedances that are set in accordance with the transistor sizes of the transistors Mc and Md, respectively. In this way, the signal transmission circuit 40 reduces the power consumption of the switch circuit 60.

The voltage adjustment unit 56 includes a regulator 68 and a regulator 70. The regulators 68 and 70 function as an example of third voltage sources used in the technique disclosed herein. The regulator 68 includes a current source 72 and a capacitor 74 and outputs, as the voltage Vrin, a voltage based on a current output by the current source 72 to the switch circuit 60. The regulator 70 includes a current source 76 and a capacitor 78 and outputs, as the voltage Vrinx, a voltage based on a current output by the current source 76 to the switch circuit 60.

Each of the regulators 68 and 70 includes a comparator 80. The voltage Vrin output to the switch circuit 60 and a target voltage, which will be described later, are input to the comparator 80 of the regulator 68. This configuration allows the regulator 68 to control the current output by the current source 72 so that the voltage Vrin is substantially equal to the target voltage. The voltage Vrinx output to the switch circuit 60 and a target voltage, which will be described later, are input to the comparator 80 of the regulator 70. This configuration allows the regulator 70 to control the current output by the current source 76 so that the voltage Vrinx is substantially equal to the target voltage.

The target voltage input to the regulator 68 is also output, as the voltage Vrefd, to the regulator 44 of the pre-driver unit 42. The target voltage input to the regulator 70 is output, as the voltage Vrefs, to the regulator 46 of the pre-driver unit 42. Accordingly, in the voltage adjustment unit 56, the regulator 68 functions as the regulator 44 of the pre-driver unit 42 and the regulator 70 functions as the regulator 46 of the pre-driver unit 42.

The voltage adjustment unit 56 also includes a logic circuit 82 and digital-to-analog converters (DACs) 84A and 84B. The logic circuit 82 and the DACs 84A and 84B function as parts of an adjustment unit used in the technique disclosed herein. The voltages vout and voutx output from the switch circuit 60 and the voltages Vddtx and Vsstx output from the driver unit 20 are input to the logic circuit 82. The logic circuit 82 outputs, for example, n-bit digital signals to the DACs 84A and 84B.

The DAC 84A is provided on the regulator 68 side and performs digital-to-analog conversion on the digital signal input from the logic circuit 82. The DAC 84A then outputs the voltage Vrefd serving as the target voltage to the comparator 80 and the regulator 44 of the pre-driver unit 42. On the other hand, the DAC 84B is provided on the regulator 70 side and performs digital-to-analog conversion on the digital signal input from the logic circuit 82. The DAC 84B then outputs the voltage Vrefs serving as the target voltage to the comparator 80 and the regulator 46 of the pre-driver unit 42.

Figure 8:
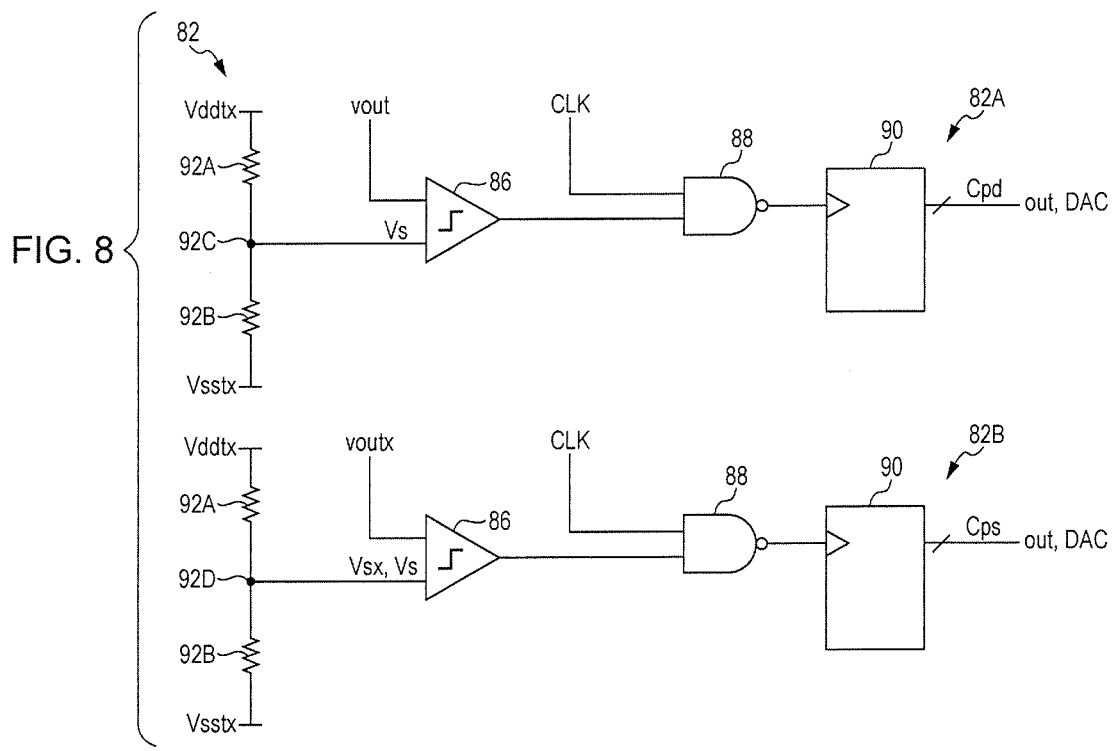
FIG. 8 illustrates a logic circuit according to the second embodiment.

FIG. 8 illustrates an example of the logic circuit 82 according to the second embodiment. The logic circuit 82 includes a logic circuit 82A for the DAC 84A and a logic circuit 82B for the DAC 84B. Each of the logic circuits 82A and 82B includes a comparator 86, a NAND circuit (hereinafter, referred to as a NAND) 88, and a counter circuit (hereinafter, referred to as a counter) 90.

Each of the logic circuits 82A and 82B also includes a resistor 92A and a resistor 92B. The resistors 92A and 92B are connected in series. The voltage Vddtx is applied to the resistor 92A, whereas the voltage Vsstx is applied to the resistor 92B.

In the logic circuit 82A, a voltage Vs at a node 92C between the resistors 92A and 92B and the voltage vout are input to the comparator 86. The comparator 86 outputs the comparison result based on the voltages Vs and vout to the NAND 88. In the logic circuit 82B, a voltage Vsx at a node 92D between the resistors 92A and 92B and the voltage voutx are input to the comparator 86. The comparator 86 outputs the comparison result based on the voltages Vsx and voutx to the NAND 88.

Also, in each of the logic circuits 82A and 82B, a clock signal CLK is input to the NAND 88. The NAND 88 outputs, to the counter 90, a pulse signal that is based on the clock signal CLK and the comparison result output by the comparator 86. The counter 90 counts pulses of the pulse signal in response to input of the pulse signal from the NAND 88 and outputs a counted value.

In the second embodiment, the resistors 92A and 92B have the same resistance. Accordingly, the voltages Vs and Vsx output as reference voltages to the comparators 86 are expressed as Vs=(Vddtx−Vsstx)/2 (=Vsx, which is hereinafter denoted by Vs in the second embodiment).

In the logic circuit 82A, when the voltage vout is lower than the voltage Vs, the output of the comparator 86 indicates a high level and the NAND 88 outputs pulses in accordance with the clock signal CLK. The counter 90 counts these pulses. Also in the logic circuit 82A, upon the voltage vout reaching the voltage Vs, the output of the comparator 86 changes to a low level and the NAND 88 stops outputting pulses. The counter 90 also stops counting.

In the logic circuit 82B, when the voltage voutx is lower than the voltage Vs, the output of the comparator 86 indicates a high level and the NAND 88 outputs pulses in accordance with the clock signal CLK. The counter 90 counts these pulses. Also in the logic circuit 82B, upon the voltage voutx reaching the voltage Vs, the output of the comparator 86 changes to a low level and the NAND 88 stops outputting pulses. The counter 90 also stops counting.

The logic circuit 82A outputs digital data (hereinafter, referred to as a value Cpd) based on the value counted by the counter 90. The logic circuit 82B outputs digital data (hereinafter, referred to as a value Cps) based on the value counted by the counter 90.

As illustrated in FIG. 7, in the voltage adjustment unit 56, the value Cpd output from the logic circuit 82A is input to the DAC 84A and the value Cps output from the logic circuit 82B is input to the DAC 84B. The DAC 84A outputs the voltage Vrefd based on the digital data of the value Cpd, thereby controlling the voltage Vrin output by the regulator 68 to make the voltage vout substantially equal to the voltage Vs. The DAC 84B outputs the voltage Vrefs based on the digital data of the value Cps, thereby controlling the voltage Vrinx output by the regulator 70 to make the voltage voutx substantially equal to the voltage Vs. In this way, the voltage adjustment unit 56 performs control to make the voltages vout and voutx output from the switch circuit 60 substantially equal to the voltage Vs.

Now, let a voltage Vb represent a voltage change caused by each of the regulators 68 and 70. Then, the voltage Vrin output by the regulator 68 is expressed as Vrin=Vddtx+Vb and the voltage Vrinx output by the regulator 70 is expressed as Vrinx=Vsstx−Vb. The switch circuit 60 uses the resistor switches 62 of the symmetric load type and the output impedance changes in accordance with this voltage Vb. Also, in the switch circuit 60, the voltages vout and voutx are adjusted to match the voltage Vs by setting the output impedance to match the resistances Rref of the resistors 66A and 66B.

FIGS. 9A to 9E illustrate changes in impedances of the resistor switches 62 and a total impedance of the impedance of the resistor switch 62 on the pull-up side and the impedance of the resistor switch 62 on the pull-down side against a change in the voltage Vb when the resistance Rref is 50 Ω.

FIGS. 9A to 9E illustrate impedances against the voltage Vb when the target output impedance of the switch circuit 60 is set to 50 Ω. In FIGS. 9A to 9E, lower diagrams illustrate the impedances of the resistor switches 62, whereas upper diagrams illustrate the total impedance of the impedances of the resistor switches 62 on the pull-up and pull-down sides. In the lower diagrams of FIGS. 9A to 9E, a solid line represents the impedance on the pull-up side and a dash line represents the impedance on the pull-down side. Reference voltages Vm and Vn to be compared satisfy a relationship of Vm<Vn.

Transistors included in the LSI 18 possibly have characteristics regarding the operation speed that are different from designed characteristics because of the fabrication process or the like. It is assumed here that "T" represents a characteristic for operating at the designed speed of the transistor, "F" represents a characteristic for operating faster than the designed speed, and "S" represents a characteristic for operating slower than the designed speed. The characteristics regarding the operation speed may differ between NMOS transistors and PMOS transistors.

Figure 9:
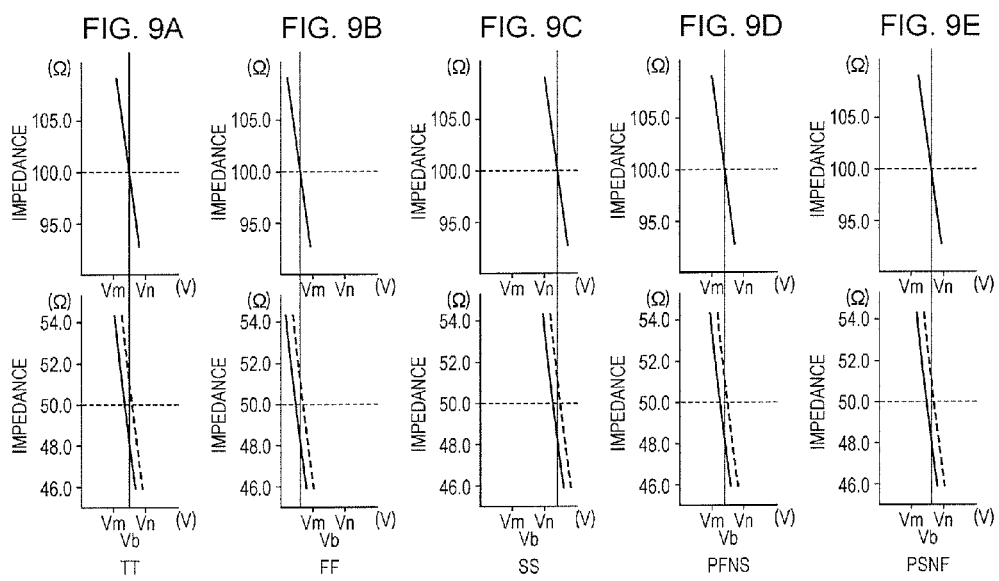
FIGS. 9A to 9E illustrate impedances of resistor switches and a total impedance of impedances of the resistor switches against a voltage Vb according to the second embodiment.

FIG. 9A illustrates a case where PMOS transistors and NMOS transistors have the characteristic "T" (referred to as TT). FIG. 9B illustrates a case where PMOS transistors and NMOS transistors have the characteristic "F" (referred to as FF). FIG. 9C illustrates a case where PMOS transistors and NMOS transistors have the characteristic "S" (referred to as SS). FIG. 9D illustrates a case where PMOS transistors have the characteristic "F" and NMOS transistors have the characteristic "S" (referred to as PFNS). FIG. 9E illustrates a case where PMOS transistors have the characteristic "S" and NMOS transistors have the characteristic "F" (referred to as PSNF).

As illustrated in FIGS. 9A to 9E, the impedances of the resistor switches 62 change depending on the voltage Vb. With this change, the total impedance also changes. When the characteristic is SS, the impedances for a certain level of the voltage Vb are higher than those of the characteristics TT, PFNS, and PSNF. When the characteristic is FF, the impedances for a certain level of the voltage Vb are lower than those of the characteristics "TT", "PFNS", and "PSNF". Regarding each characteristic, the lower the voltage Vb, the larger the impedance, and the impedance lowers as the voltage Vb rises.

This voltage Vb is a voltage input to the gates G of the transistors Mc and Md. The impedances of switches of the symmetric load type change in accordance with voltages applied to gates G of transistors.

Here, suppose that the total impedance is set to a value (for example, 100 Ω) corresponding to a target impedance. In this way, the impedance of each of the resistor switches 62 included in the switch circuit 60 provided as a replica of the driver circuit 26 may be adjusted to match the target impedance (50 Ω). That is, the output impedance of the switch circuit 60 may be adjusted to match the resistance Rref of the resistors 66A and 66B by adjusting the voltage input to the gates G of the transistors Mc and Md.

As illustrated in FIG. 6, in the signal transmission circuit 40, the voltage Vrefd output from the DAC 84A of the voltage adjustment unit 56 is input to the comparator 58 on the pre-driver 22A side. This configuration allows the pre-driver unit 42 to adjust the voltage Vddpr output by the regulator 44 to match the voltage Vrefd. Also in the signal transmission circuit 40, the voltage Vrefs output from the DAC 84B of the voltage adjustment unit 56 is input to the comparator 58 on the pre-driver 22B side. This configuration allows the pre-driver unit 42 to adjust the voltage Vsspr output by the regulator 46 to match the voltage Vrefs.

In this way, the pre-driver 22A outputs the voltage Vin based on the voltage Vrin input to the switch circuit 60 and the pre-driver 22B outputs the voltage Vinx based on the voltage Vrinx input to the switch circuit 60.

At this time, the voltages Vrin and Vrinx are voltages with which the output impedance of the switch circuit 60 serving as a replica of the driver circuit 26 is adjusted to match the impedance of the resistors 66A and 66B, which is set in accordance with the characteristic impedance Zo of the transmission line 14. In this way, the driver circuit 26 outputs the voltages Vout and Voutx to the transmission line 14 with the output impedance Zout thereof matching the characteristic impedance Zo of the transmission line 14. Accordingly, the signal transmission circuit 40 may reduce the power consumption by using symmetric loads and may transmit the transmission signals S and Sx at a high transmission efficiency.

A third embodiment of the technique disclosed herein will be described next. A basic configuration of the third embodiment is substantially the same as that of the second embodiment. In the third embodiment, functional components that are similar to those of the second embodiment are assigned the same reference numerals as those of the first embodiment and a description thereof is omitted.

Figure 10:
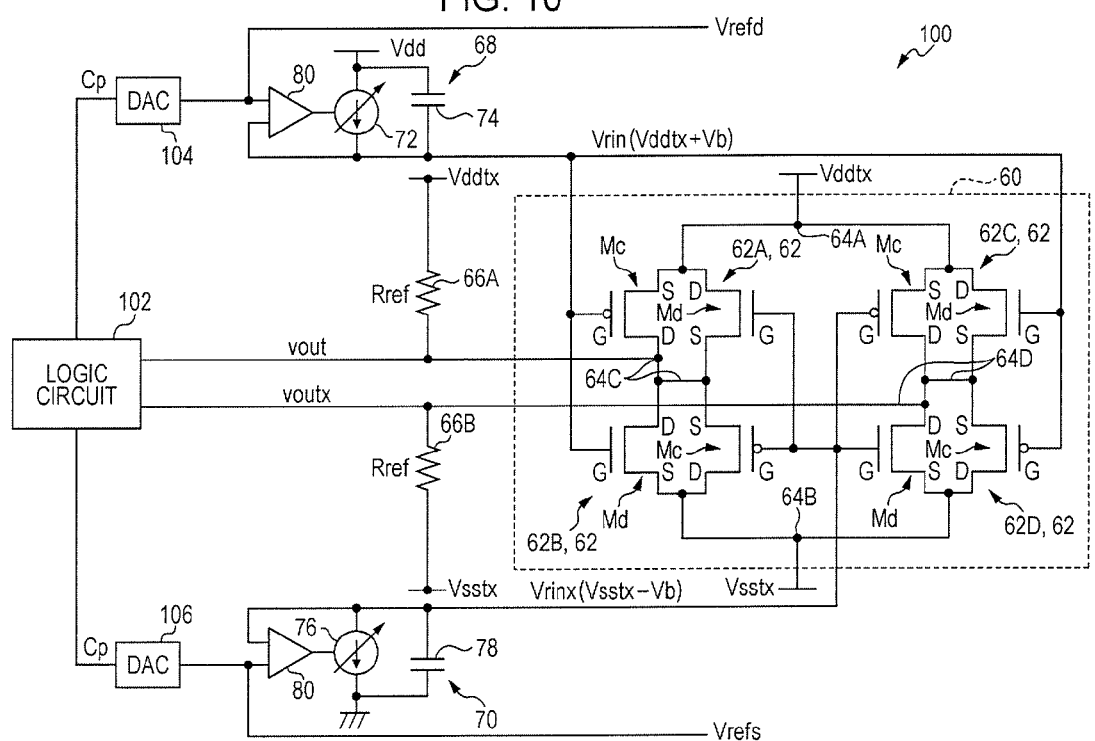
FIG. 10 illustrates components of a voltage adjustment unit according to a third embodiment.

In the third embodiment, the signal transmission circuit 40 according to the second embodiment uses a voltage adjustment unit 100 instead of the voltage adjustment unit 56. The voltage adjustment unit 100 functions as an example of a voltage adjustment unit used in the technique disclosed herein. FIG. 10 illustrates an example of this voltage adjustment unit 100. The voltage adjustment unit 100 includes a logic circuit 102 instead of the logic circuit 82. The voltage adjustment unit 100 also includes a DAC 104 and a DAC 106 instead of the DAC 84A and the DAC 84B, respectively.

Figure 11:
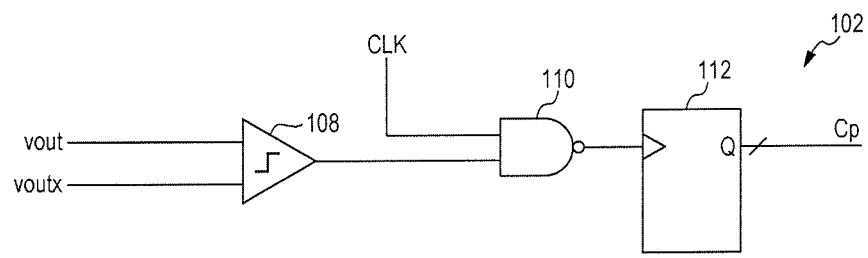
FIG. 11 illustrates a logic circuit according to the third embodiment.

FIG. 11 illustrates an example of the logic circuit 102 according to the third embodiment. The logic circuit 102 includes a comparator 108, a NAND circuit (hereinafter referred to as a NAND) 110, and a counter circuit (hereinafter, referred to as a counter) 112. In the logic circuit 102, voltages vout and voutx output from a switch circuit 60 are input to the comparator 108. The output of the comparator 108 and a clock signal CLK are input to the NAND 110. Pulses output by the NAND 110 in accordance with the clock signal CLK are input to the counter 112. The counter 112 counts these pulses.

The comparator 108 compares the voltages vout and voutx with each other. For example, when the voltage vout is lower than the voltage voutx, the comparator 108 outputs a high-level signal. The comparator 108 changes the output signal to a low-level signal upon the voltage vout reaching the voltage voutx. The NAND 110 outputs pulses in synchronization with the clock signal CLK while the comparator 108 is outputting the high-level signal. When the output signal of the comparator 108 changes to the low level, the NAND 110 stops outputting pulses.

As a result, in the logic circuit 102, the value counted by the counter 112 is incremented and output while the voltage vout is lower than the voltage voutx in the case where the voltages vout and voutx are changed relative to each other. Also, in the logic circuit 102, the increment performed by the counter 112 stops upon the voltage vout reaching the voltage voutx. The counter 112 outputs, for example, n-bit data. The data output by the counter 112 is not limited to the n-bit data and the counter 112 may output binary data in accordance with the DACs 104 and 106 or the like.

Figure 12:
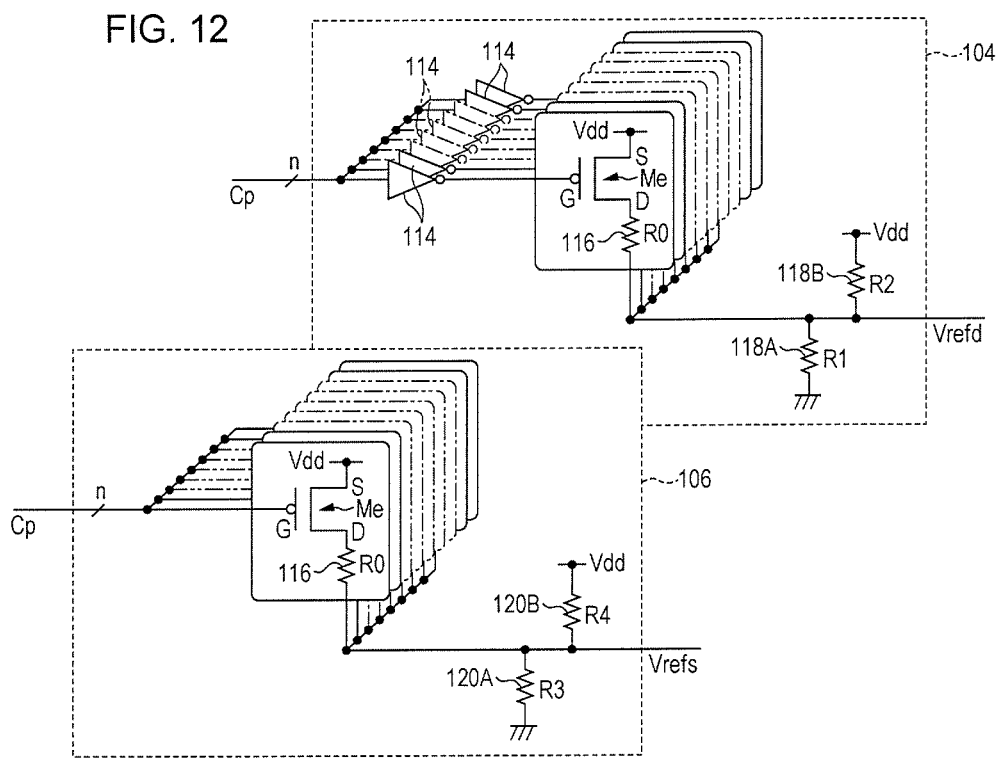
FIG. 12 illustrates components of digital-to-analog converters (DACs) according to the third embodiment.

As illustrated in FIG. 10, a value Cp counted by the logic circuit 102 is input to each of the DACs 104 and 106. FIG. 12 illustrates the DACs 104 and 106 according to the third embodiment. The DAC 104 differs from the DAC 106 in that the DAC 104 includes inverters 114. The inverters 114 may be included in the logic circuit 102.

Each of the DACs 104 and 106 includes transistors Me and resistors 116. PMOS transistors are used as the transistors Me and the resistors 116 each have a resistance R0. In each of the DACs 104 and 106, pairs of the transistor Me and the resistor 116, the number of which corresponds to the number of bits n of the data that is output by the counter 112 (see FIG. 11) as the value Cp, are connected in parallel.

In each of the DACs 104 and 106, a drain D of each of the transistors Me is connected to one end of the corresponding resistor 116. Also in the DAC 104, the other end of each of the resistors 116 is connected to a resistor 118A having a resistance R1 and a resistor 118B having a resistance R2. In the DAC 106, the other end of each of the resistors 116 is connected to a resistor 120A having a resistance R3 and a resistor 120B having a resistance R4.

In the DAC 104, a voltage Vdd is applied to a source S of each of the transistors Me and to the resistor 118B, whereas the resistor 118A is grounded. In the DAC 106, the voltage Vdd is applied to the source S of each of the transistors Me and to the resistor 120B, whereas the resistor 120A is grounded.

In the DAC 106, the bit data of the value Cp is input to gates G of the transistors Me. The transistors Me are turned on or off in accordance with this bit data. The DAC 104 includes the inverters 114 for the respective transistors Me. The bit data of the value Cp is input to the gates G of the transistors Me via the inverters 114 and the transistors Me are turned on or off in accordance with this bit data. With this configuration, when the value Cp is zero, n transistors Me are turned on in the DAC 106 and n transistors Me are turned off in the DAC 104. As the value Cp increases, the number of transistors Me that are driven to be turned on increases in accordance with the value Cp in the DAC 106 and the number of transistors Me that are driven to be turned on decreases in accordance with the value Cp in the DAC 104.

Voltages Vrefd and Vrefs that are output by the DACs 104 and 106 when the value Cp is zero serve as initial values, respectively. In the DAC 104, the initial value of the voltage Vrefd is set in accordance with a ratio between the resistance R2 of the resistor 118B and the resistance R1 of the resistor 118A. In the DAC 106, the initial value of the voltage Vrefs is set in accordance with a ratio between the resistance R4 of the resistor 120B and a total resistance of the resistances R0 of the n resistors 116 and the resistance R3 of the resistor 120A.

As illustrated in FIG. 10, in the voltage adjustment unit 100, the voltage Vrefd output by the DAC 104 is input to a comparator 80 included in a regulator 68. Also in the voltage adjustment unit 100, the voltage Vrefs output by the DAC 106 is input to the comparator 80 included in a regulator 70. With this configuration, in the voltage adjustment unit 100, a voltage Vrin output by the regulator 68 rises in accordance with an increase in the value Cp and a voltage Vrinx output by the regulator 70 lowers in accordance with an increase in the value Cp.

Figure 13:
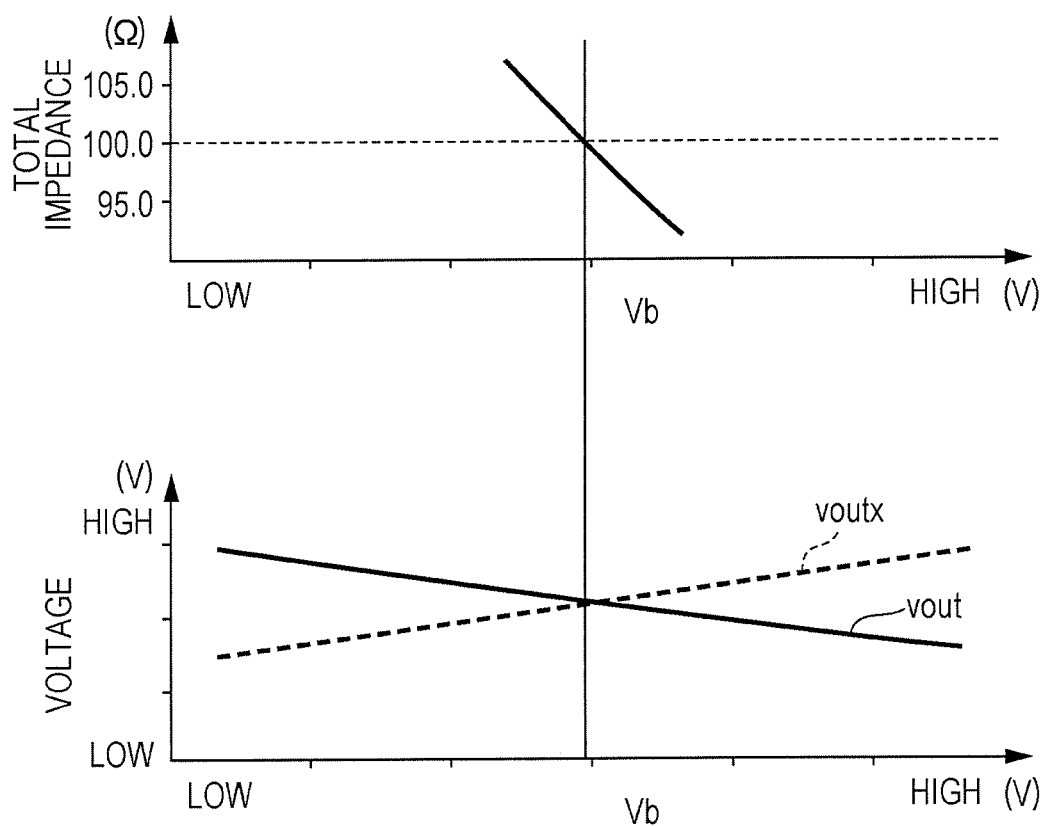
FIG. 13 illustrates voltages output by a switch circuit and a total impedance against a voltage Vb according to the third embodiment.

Now suppose that the voltage Vrin output by the regulator 68 is expressed as Vrin=Vddtx+Vb and the voltage Vrinx output by the regulator 70 is expressed as Vrinx=Vsstx−Vb. FIG. 13 illustrates changes in the voltages vout and voutx against a change in the voltage Vb in this case (illustrated in a lower diagram of FIG. 13) and a change in a total impedance of impedances of the resistor switches 62 on the pull-up and pull-down sides (illustrated in an upper diagram of FIG. 13). In the lower diagram of FIG. 13, a solid line represents the voltage vout and a dash line represents the voltage voutx.

The voltage adjustment unit 100 controls the voltages Vrin and Vrinx using the logic circuit 102 to make the voltages vout and voutx output by the switch circuit 60, which is a replica of the driver circuit 26, match each other. As illustrated in FIG. 13, the voltage adjustment unit 100 adjusts the voltages vout and voutx to match each other, thereby successfully adjusting the total impedance of the impedances on the pull-up and pull-down sides to match an impedance (for example, 100 Ω) corresponding to the resistance Rref of the resistors 66A and 66B, which serves as a reference.

Accordingly, the signal transmission circuit 40 using the voltage adjustment unit 100 may adjust an output impedance Zout of the driver circuit 26 to match a characteristic impedance Zo of a transmission line 14 by controlling voltages Vddpr and Vsspr in accordance with the voltages Vrefd and Vrefs output from the voltage adjustment unit 100. Also, the signal transmission circuit 40 using the voltage adjustment unit 100 may perform efficient and highly accurate signal transmission by adjusting the output impedance Zout of the driver circuit 26 to match the characteristic impedance Zo of the transmission line 14.

A fourth embodiment of the technique disclosed herein will be described next. A basic configuration of the fourth embodiment is substantially the same as that of the second embodiment. In the fourth embodiment, functional components that are similar to those of the second embodiment are assigned the same reference numerals as those of the second embodiment and a description thereof is omitted.

Figure 14:
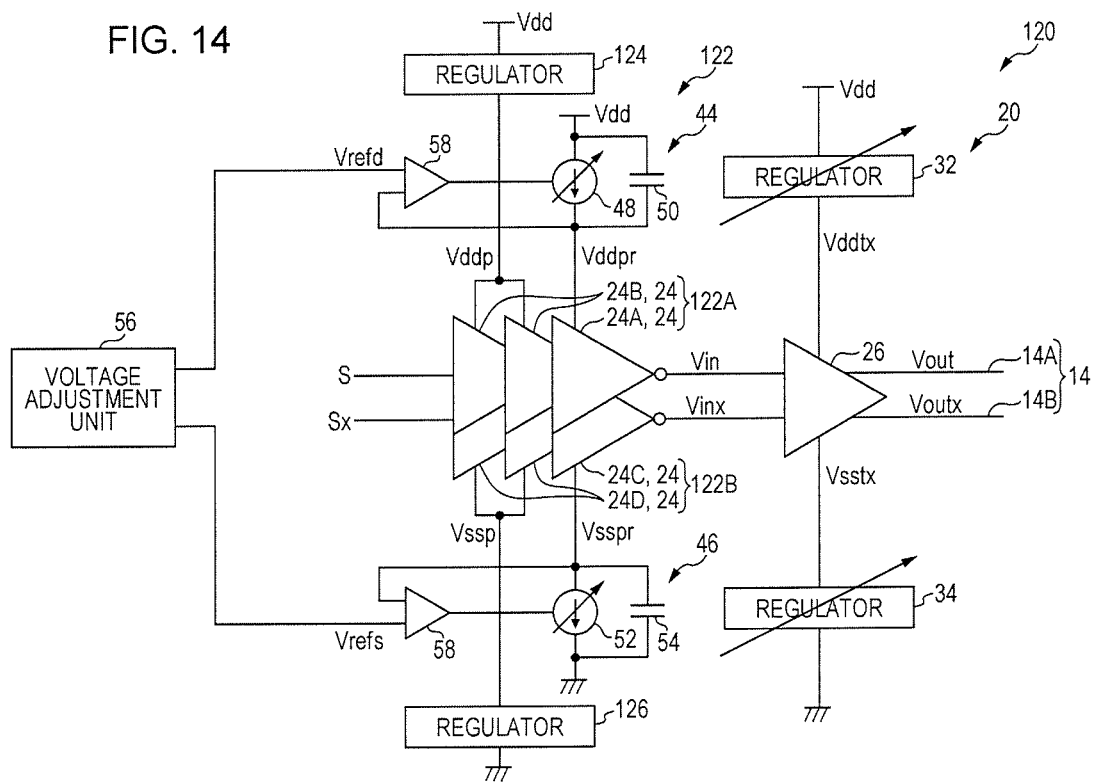
FIG. 14 illustrates components of a signal transmission circuit according to a fourth embodiment.

FIG. 14 illustrates a schematic configuration of a signal transmission circuit 120 according to the fourth embodiment. The signal transmission circuit 120 differs from the signal transmission circuit 40 described above in that a pre-driver unit 122 differs from the pre-driver unit 42. The pre-driver unit 122 according to the fourth embodiment includes a regulator 124 and a regulator 126 in addition to regulators 44 and 46 whose output voltages are variable.

The regulator 124 outputs a preset voltage (hereinafter, referred to as a voltage Vddp in the fourth embodiment) to inverters 24. The regulator 126 outputs a preset voltage (hereinafter, referred to as a voltage Vssp in the fourth embodiment) to the inverters 24.

In the signal transmission circuit 120, the inverters 24 included in a pre-driver 122A on a transmission signal S side are classified into an inverter 24A that is on the final stage and is connected to a driver unit 20 and inverters 24B that are on the transmission signal S input side relative to this inverter 24A. In the pre-driver 122A, a voltage Vddpr output from the regulator 44 is supplied to the inverter 24A and the voltage Vddp output from the regulator 124 is input to the inverters 24B.

Also in the signal transmission circuit 120, the inverters 24 included in a pre-driver 122B on a transmission signal Sx side are classified into an inverter 24C that is on the final stage and is connected to the driver unit 20 and inverters 24D that are on the transmission signal Sx input side relative to this inverter 24C. In the pre-driver 122B, a voltage Vsspr output from the regulator 46 is supplied to the inverter 24C and the voltage Vssp output from the regulator 126 is input to the inverters 24D.

That is, in the pre-driver unit 122, the inverter 24A on the final stage of the pre-driver 122A is driven in accordance with the voltage Vddpr adjusted by the voltage adjustment unit 56. Also, in the pre-driver unit 122, the inverter 24C on the final stage of the pre-driver 122B is driven in accordance with the voltage Vsspr adjusted by the voltage adjustment unit 56.

With this configuration, in the signal transmission circuit 120, voltages Vin and Vinx adjusted by the voltage adjustment unit 56 are input to the driver circuit 26. The signal transmission circuit 120 may adjust an output impedance Zout of the driver unit 20 (the driver circuit 26) at a high precision using the voltage adjustment unit 56. As a result, the accuracy and efficiency of signal transmission improve because of a reduction in power consumption and highly precise impedance matching to a characteristic impedance Zo.

The signal transmission circuit 120 may use the voltage adjustment unit 100 instead of the voltage adjustment unit 56.

A fifth embodiment of the technique disclosed herein will be described next. A basic configuration of the fifth embodiment is substantially the same as that of the second embodiment. In the fifth embodiment, functional components that are similar to those of the second embodiment are assigned the same reference numerals as those of the second embodiment and a description thereof is omitted.

Figure 15:
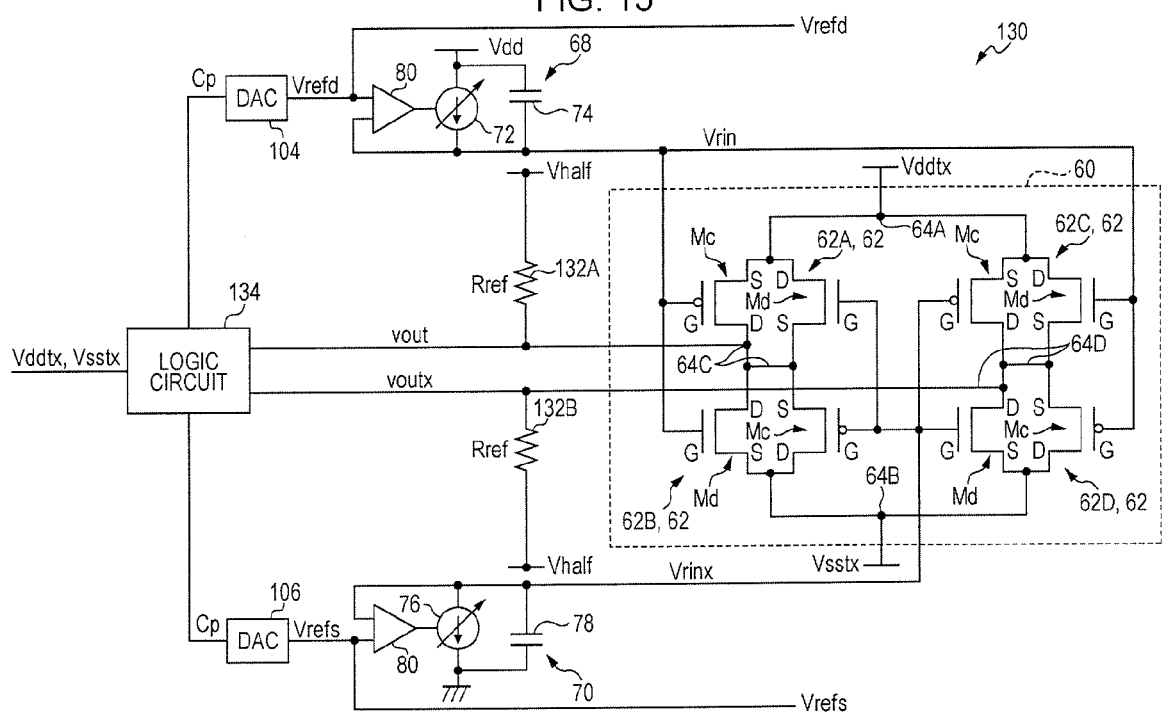
FIG. 15 illustrates components of a voltage adjustment unit according to a fifth embodiment.

In the fifth embodiment, a voltage adjustment unit 130 differs from those of the second to fourth embodiments. FIG. 15 illustrates an example of the voltage adjustment unit 130 according to the fifth embodiment. The voltage adjustment unit 130 may be used in the signal transmission circuit 40 according to the second embodiment and the signal transmission circuit 120 according to the fourth embodiment.

The voltage adjustment unit 130 functions as an example of a voltage adjustment unit used in the technique disclosed herein. In the voltage adjustment unit 130, resistors 132A and 132B each having a resistance Rref are connected to a switch circuit 60. In the fifth embodiment, a voltage Vhalf is supplied to the resistor 132A connected to a node 64C of the switch circuit 60 and to the resistor 132B connected to a node 64D of the switch circuit 60. The voltage Vhalf is set to be ½ of a difference between a voltage Vddtx output by a regulator 32 of a driver unit 20 and a voltage Vsstx output by a regulator 34 of the driver unit 20. That is, the voltage Vhalf is expressed as Vhalf=(Vddtx−Vsstx)/2.

Accordingly, in the voltage adjustment unit 130, a voltage vout is determined by the voltage Vhalf, the resistance Rref of the resistor 132A, and an impedance of the switch circuit 60 and a voltage voutx is determined by the voltage Vhalf, the resistance Rref of the resistor 132B, and the impedance of the switch circuit 60.

The voltage adjustment unit 130 includes a logic circuit 134. The voltage vout at the node 64C of the switch circuit 60, the voltage voutx at the node 64D of the switch circuit 60, and the voltages Vddtx and Vsstx output from the driver unit 20 are input to the logic circuit 134. The voltage adjustment unit 130 also includes a DAC 104 on a regulator 68 side and a DAC 106 on a regulator 70 side. A voltage Vrin output from the regulator 68 is controlled in accordance with a voltage Vrefd output from the DAC 104, whereas a voltage Vrinx output from the regulator 70 is controlled in accordance with a voltage Vrefs output from the DAC 106.

Figure 16:
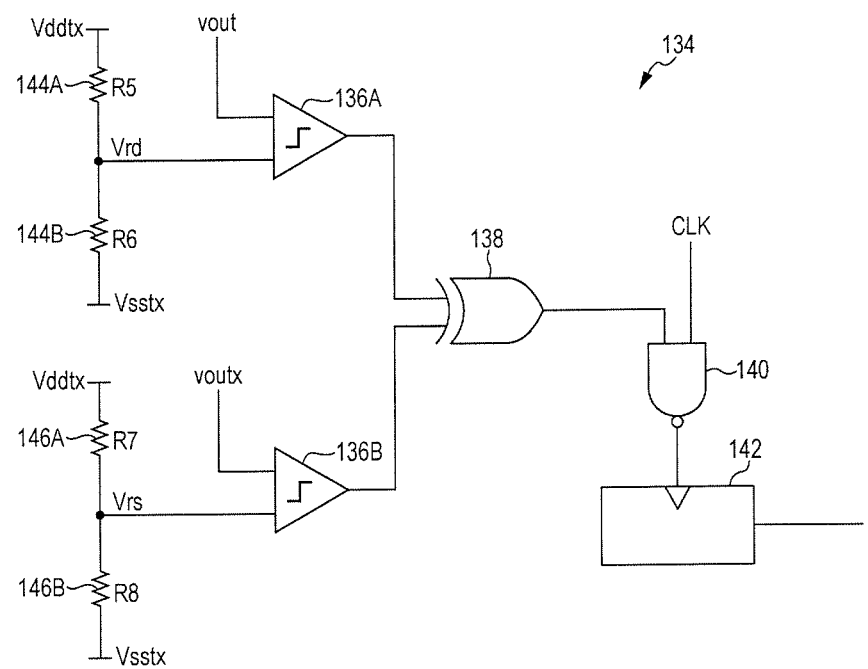
FIG. 16 illustrates a logic circuit according to the fifth embodiment.

FIG. 16 illustrates an example of the logic circuit 134 according to the fifth embodiment. The logic circuit 134 includes a comparator 136A, a comparator 136B, and an exclusive-or circuit (hereinafter, referred to as an XOR) 138 to which signals output from the comparators 136A and 136B are input. The logic circuit 134 also includes a NAND circuit (hereinafter, referred to as a NAND) 140 to which an output signal of the XOR 138 and a clock signal CLK are input, and a counter circuit (hereinafter, referred to as a counter) 142 that counts pulses output from the NAND 140.

The logic circuit 134 further includes resistors 144A and 144B and resistors 146A and 146B. The voltage Vddtx is applied to one end of the resistors 144A and 144B connected in series, whereas the voltage Vsstx is applied to the other end thereof. A divided voltage obtained by the resistors 144A and 144B is input to the comparator 136A. The voltage vout is also input to the comparator 136A.

The voltage Vddtx is applied to one end of the resistors 146A and 146B connected in series, whereas the voltage Vsstx is applied to the other end thereof. A divided voltage obtained by the resistors 146A and 146B is input to the comparator 136B. The voltage voutx is also input to the comparator 136B.

As illustrated in FIG. 15, the voltage Vhalf is applied to the resistors 132A and 132B in the voltage adjustment unit 130. Also, as illustrated in FIG. 16, in the logic circuit 134, a voltage Vrd, which is output as a reference voltage, is obtained through voltage division performed by the resistors 144A and 144B, whereas a voltage Vrs, which is output as a reference voltage, is obtained through voltage division performed by the resistors 146A and 146B. Accordingly, resistances of the individual resistors 144A, 144B, 146A, and 146B are set in accordance with the voltages Vrd, Vrs, and Vhalf.

Specifically, the voltage Vrd corresponding to the voltage vout is expressed as $Vrd=(Vddtx-Vsstx)/4$. In accordance with this voltage Vrd, a resistance R5 of the resistor 144A and a resistance R6 of the resistor 144B are set. Also, the voltage Vrs corresponding to the voltage voutx is expressed as $Vrs=(Vddtx-Vsstx)\cdot 3/4$. In accordance with this voltage Vrs, a resistance R7 of the resistor 146A and a resistance R8 of the resistor 146B are set.

With this configuration, the XOR 138 outputs a high-level signal while the voltage vout is lower than the voltage Vrd or the voltage voutx is lower than the voltage Vrs. That is, the output signal of the XOR 138 changes to a low level from the high level upon the voltage vout becoming higher than the voltage Vrd or the voltage Voutx becoming higher than the voltage Vrs. The NAND 140 outputs pulses in accordance with the clock signal CLK. The NAND 140 stops outputting pulses upon the voltage vout reaching the voltage Vrd and the voltage Voutx reaching the voltage Vrs.

While the NAND 140 is outputting pulses, the logic circuit 134 counts these pulses and outputs a value Cp. When the NAND 140 stops outputting pulses, the counter 142 stops counting and the logic circuit 134 outputs the value Cp obtained at that time.

As illustrated in FIG. 15, in the voltage adjustment unit 130, the value Cp counted in the logic circuit 134 is input to each of the DACs 104 and 106. The DAC 104 outputs the voltage Vrefd that is based on the value Cp. The regulator 68 outputs the voltage Vrin that is based on the voltage Vrefd. The DAC 106 outputs the voltage Vrefs that is based on the value Cp. The regulator 70 outputs the voltage Vrinx that is based on the voltage Vrefs.

Figure 17:
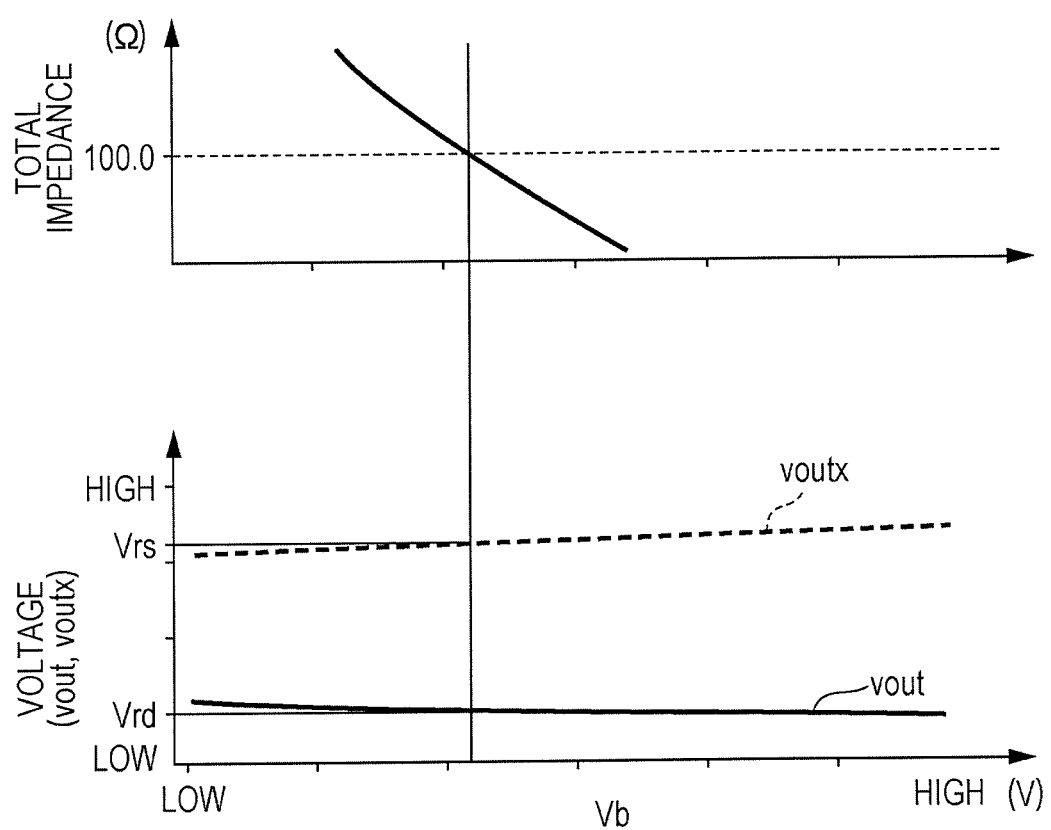
FIG. 17 illustrates voltages output by a switch circuit and a total impedance against a voltage Vb according to the fifth embodiment.

Now suppose that the voltage Vrin output by the regulator 68 is expressed as $Vrin=Vddtx+Vb$ and the voltage Vrinx output by the regulator 70 is expressed as $Vrinx=Vsstx-Vb$ in the fifth embodiment. FIG. 17 illustrates changes in the voltages vout and voutx against a change in the voltage Vb in this case (illustrated in a lower diagram of FIG. 17) and a change in a total impedance of impedances of the resistor switches 62 on the pull-up and pull-down sides (illustrated in an upper diagram of FIG. 17). In the lower diagram of FIG. 17, a solid line represents the voltage vout and a dash line represents the voltage voutx.

As illustrated in FIG. 17, the voltages vout and voutx output from the switch circuit 60 of the voltage adjustment unit 130 change in accordance with the voltage Vb. With these changes, the total impedance also changes.

When the voltage vout reaches the voltage Vrd and the voltage voutx reaches the voltage Vrs, the total impedance reaches a target impedance of 100 Ω. In this way, the voltage adjustment unit 130 may adjust the output impedance of the switch circuit 60 to match the target impedance using the logic circuit 134.

The voltage adjustment unit 130 controls voltages Vddpr and Vsspr input to a pre-driver unit 22, ultimately, voltages Vin and Vinx input to the driver circuit 26 of the driver unit 20, using the voltages Vrefd and Vrefs determined at this time.

In this way, the voltage adjustment unit 130 may adjust an output impedance Zout of the driver circuit 26 to match a characteristic impedance Zo of a transmission line 14.

The first to fifth embodiments described above do not limit the technique disclosed herein. The technique disclosed herein may be carried out in forms such that individual components have intended functions other than the forms described in the embodiments above. All the patent applications and technical documents described in the patent applications that are cited herein are incorporated herein by reference to the same extent as if each individual document, application or standard was specifically and individually indicated to be incorporated herein by reference.

Additional Notes for Embodiments

Note 1. A signal transmission circuit, comprising: a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to a transmission line; and first voltage sources that supply operating voltages to the driver circuit so as to adjust amplitudes of the complementary voltages output from the driver circuit to the transmission line.

Note 2. A signal transmission circuit, comprising: a driver circuit that includes complementary inverters, each of the complementary inverters including a plurality of transistor switches of a symmetric load type, each of the plurality of transistor switches including a pair of transistors, and that drives each of the plurality of transistor switches in accordance with complementary signals so as to output complementary voltages to a transmission line; and first voltage sources that supply operating voltages to the driver circuit so as to adjust amplitudes of the complementary voltages output from the driver circuit to the transmission line.

Note 3. The signal transmission circuit according to note 1, further comprising: pre-drivers that output, to the driver circuit, complementary driving voltages for driving each of the plurality of transistor switches in accordance with the complementary signals; and second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line.

Note 4. The signal transmission circuit according to note 2, further comprising: pre-drivers that output, to the driver circuit, complementary driving voltages for driving each of the plurality of transistor switches in accordance with the complementary signals; and second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line.

Note 5. The signal transmission circuit according to note 3, further comprising: a voltage adjustment unit that adjusts the operating voltages output by the second voltage sources, in accordance with the operating voltages output by the first voltage sources.

Note 6. A signal transmission circuit according to note 5, wherein the voltage adjustment unit includes a replica circuit of the driver circuit, the replica circuit including switches that correspond to the plurality of transistor switches, third voltage sources that output, to the replica circuit, driving voltages for driving each of the switches, and an adjustment unit that adjusts the driving voltages output by the third voltage sources such that voltages output by the replica circuit allow an impedance of the replica circuit to match an impedance corresponding to the characteristic impedance of the transmission line, and wherein the operating voltages output by the second voltage sources are adjusted in accordance with the driving voltages output by the third voltage sources and adjusted by the adjustment unit.

Note 7. The signal transmission circuit according to note 6, wherein the adjustment unit includes comparator units that compare the voltages output by the replica circuit with reference voltages that are set in accordance with the operating voltages output by the first voltage sources, and target voltage generation units that generate target voltages of the driving voltages output by the third voltage sources so as to make the voltages output by the replica circuit equal to the reference voltages.

Note 8. The signal transmission circuit according to note 6, wherein the adjustment unit includes a comparator unit that compares the voltages output by the replica circuit with each other, the voltages output by the replica circuit being complementary voltages, and target voltage generation units that generate target voltages of the driving voltages output by the third voltage sources so as to decrease a difference between the complementary voltages output by the replica circuit.

Note 9. A signal transmission system, comprising: a transmission line; and a signal transmission circuit including a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to the transmission line, and first voltage sources that supply operating voltages to the driver circuit so as to adjust amplitudes of the complementary voltages output from the driver circuit to the transmission line.

Note 10. A signal transmission system, comprising: a transmission line; and a signal transmission circuit including a driver circuit that includes complementary inverters, each of the complementary inverters including a plurality of transistor switches of a symmetric load type, each of the plurality of transistor switches including a pair of transistors, and that drives each of the plurality of transistor switches in accordance with complementary signals so as to output complementary voltages to the transmission line, and first voltage sources that supply operating voltages to the driver circuit so as to adjust amplitudes of the complementary voltages output from the driver circuit to the transmission line.

Note 11. The signal transmission system according to note 9, wherein the signal transmission circuit further includes pre-drivers that output, to the driver circuit, complementary driving voltages for driving each of the plurality of transistor switches in accordance with the complementary signals, and second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line.

Note 12. The signal transmission system according to note 10, wherein the signal transmission circuit further includes pre-drivers that output, to the driver circuit, complementary driving voltages for driving each of the plurality of transistor switches in accordance with the complementary signals, and second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line.

Note 13. The signal transmission system according to note 11, wherein the signal transmission circuit further includes a voltage adjustment unit that adjusts the operating voltages output by the second voltage sources, in accordance with the operating voltages output by the first voltage sources.

Note 14. The signal transmission system according to note 13, wherein the voltage adjustment unit includes a replica circuit of the driver circuit, the replica circuit including switches that correspond to the plurality of transistor switches, third voltage sources that output, to the replica circuit, driving voltages for driving each of the switches, and an adjustment unit that adjusts the driving voltages output by the third voltage sources such that voltages output by the replica circuit allow an impedance of the replica circuit to match an impedance corresponding to the characteristic impedance of the transmission line, and wherein the operating voltages output by the second voltage sources are adjusted in accordance with the driving voltages output by the third voltage sources and adjusted by the adjustment unit.

Note 15. The signal transmission system according to note 14, wherein the adjustment unit includes comparator units that compare the voltages output by the replica circuit with reference voltages that are set in accordance with the operating voltages output by the first voltage sources, and target voltage generation units that generate target voltages of the driving voltages output by the third voltage sources so as to make the voltages output by the replica circuit equal to the reference voltages.

Note 16. The signal transmission system according to note 14, wherein the adjustment unit includes a comparator unit that compares the voltages output by the replica circuit with each other, the voltages output by the replica circuit being complementary voltages, and target voltage generation units that generate target voltages of the driving voltages output by the third voltage sources so as to decrease a difference between the complementary voltages output by the replica circuit.

Note 17. A signal transmission method, comprising: adjusting, with a driver circuit, amplitudes of complementary voltages to be output to a transmission line from the driver circuit, in accordance with operating voltages supplied to the driver circuit from first voltage sources, the driver circuit including complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance; and driving, with the driver circuit, each of the plurality of transistor switches of the driver circuit in accordance with complementary signals so as to output the complementary voltages to the transmission line.

Note 18. A signal transmission method, comprising: adjusting, with a driver circuit, amplitudes of complementary voltages to be output to a transmission line from the driver circuit, in accordance with operating voltages supplied to the driver circuit from first voltage sources, the driver circuit including complementary inverters, each of the complementary inverters including a plurality of transistor switches of a symmetric load type, each of the plurality of transistor switches including a pair of transistors; and driving, with the driver circuit, each of the plurality of transistor switches of the driver circuit in accordance with complementary signals so as to output the complementary voltages to the transmission line.

Note 19. The signal transmission method according to note 17, further comprising supplying operating voltages from second voltage sources to pre-drivers, the pre-drivers being configured to output, to the driver circuit, complementary driving voltages for driving each of the plurality of transistor switches in accordance with the complementary signals, the operating voltages being adjusted such that each of the plurality of transistor switches is driven in accordance with the complementary driving voltages so as to cause an impedance corresponding to a characteristic impedance of the transmission line.

Note 20. The signal transmission method according to note 18, further comprising supplying operating voltages from second voltage sources to pre-drivers, the pre-drivers being configured to output, to the driver circuit, complementary driving voltages for driving each of the plurality of transistor switches in accordance with the complementary signals, the operating voltages being adjusted such that each of the plurality of transistor switches is driven in accordance with the complementary driving voltages so as to cause an impedance corresponding to a characteristic impedance of the transmission line.

Note 21. The signal transmission method according to note 19, further comprising adjusting, with a voltage adjustment unit, the operating voltages output by the second voltage sources, in accordance with the operating voltages output by the first voltage sources.

Note 22. The signal transmission method according to note 21, further comprising: adjusting, with an adjustment unit, driving voltages supplied from third voltage sources to a replica circuit of the driver circuit such that voltages output by the replica circuit allow an impedance of the replica circuit to match an impedance corresponding to the characteristic impedance of the transmission line, the replica circuit including switches that correspond to the plurality of transistor switches, the driving voltages supplied from the third voltage sources being voltages for driving each of the switches; and adjusting the operating voltages output by the second voltage sources in accordance with the driving voltages output by the third voltage sources and adjusted with the adjustment unit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal transmission circuit, comprising:
   a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to a transmission line;
   first voltage sources that supply operating voltages to the driver circuit so as to adjust amplitudes of the complementary voltages output from the driver circuit to the transmission line;
   pre-drivers that output, to the driver circuit, complementary driving voltages for driving each of the plurality of transistor switches in accordance with the complementary signals;
   second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line; and
   a voltage adjustment unit that adjusts the operating voltages output by the second voltage sources, in accordance with the operating voltages output by the first voltage sources.

2. The signal transmission circuit according to claim 1, wherein the voltage adjustment unit comprises:
   a replica circuit of the driver circuit, the replica circuit including switches that correspond to the plurality of transistor switches;
   third voltage sources that output, to the replica circuit, driving voltages for driving each of the switches; and
   an adjustment unit that adjusts the driving voltages output by the third voltage sources such that voltages output by the replica circuit allow an impedance of the replica circuit to match an impedance corresponding to the characteristic impedance of the transmission line, and
   wherein the operating voltages output by the second voltage sources are adjusted in accordance with the driving voltages output by the third voltage sources and adjusted by the adjustment unit.

3. The signal transmission circuit according to claim 2, wherein the adjustment unit comprises:
   comparator units that compare the voltages output by the replica circuit with reference voltages that are set in accordance with the operating voltages output by the first voltage sources; and
   target voltage generation units that generate target voltages of the driving voltages output by the third voltage sources so as to make the voltages output by the replica circuit equal to the reference voltages.

4. The signal transmission circuit according to claim 2, wherein the adjustment unit comprises:
- a comparator unit that compares the voltages output by the replica circuit with each other, the voltages output by the replica circuit being complementary voltages; and
- target voltage generation units that generate target voltages of the driving voltages output by the third voltage sources so as to decrease a difference between the complementary voltages output by the replica circuit.

5. A signal transmission system, comprising:
a transmission line; and
a signal transmission circuit comprising:
- a driver circuit that includes complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance, and that drives each of the plurality of transistor switches in accordance with complementary signals so as to output complementary voltages to the transmission line;
- first voltage sources that supply operating voltages to the driver circuit so as to adjust amplitudes of the complementary voltages output from the driver circuit to the transmission line;
- pre-drivers that output, to the driver circuit, complementary driving voltages for driving each of the plurality of transistor switches in accordance with the complementary signals;
- second voltage sources that supply operating voltages to the pre-drivers, the operating voltages being adjusted such that each of the plurality of transistor switches is driven in accordance with the complementary driving voltages so as to cause an impedance corresponding to a characteristic impedance of the transmission line; and
- a voltage adjustment unit that adjusts the operating voltages output by the second voltage sources, in accordance with the operating voltages output by the first voltage sources.

6. A signal transmission method, comprising:
adjusting, with a driver circuit, amplitudes of complementary voltages to be output to a transmission line from the driver circuit, in accordance with operating voltages supplied to the driver circuit from first voltage sources, the driver circuit including complementary inverters, each of the complementary inverters including a plurality of transistor switches, each of the plurality of transistor switches including a pair of transistors, one of the pair of transistors operating in a saturation region and another of the pair of transistors operating in a triode region to cause a certain impedance;

driving, with the driver circuit, each of the plurality of transistor switches of the driver circuit in accordance with complementary signals so as to output the complementary voltages to the transmission line;

outputting, with pre-drivers and to the driver circuit, complementary driving voltages for driving each of the plurality of transistor switches in accordance with the complementary signals;

supplying, with second voltage sources, operating voltages to the pre-drivers, the operating voltages being adjusted such that each of the plurality of transistor switches is driven in accordance with the complementary driving voltages so as to cause an impedance corresponding to a characteristic impedance of the transmission line; and adjusting, with a voltage adjustment unit, the operating voltages output by the second voltage sources, in accordance with the operating voltages output by the first voltage sources.

* * * * *